(12) United States Patent
Miyamoto

(10) Patent No.: US 11,668,018 B2
(45) Date of Patent: Jun. 6, 2023

(54) CONTACT STRUCTURE, SUBSTRATE HOLDER, APPARATUS FOR PLATING, AND METHOD OF FEEDING ELECTRIC POWER TO SUBSTRATE

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

(*) Notice: Subject to any disclaimer, the term of this patent is extended or adjusted under 35 U.S.C. 154(b) by 7 days.

(21) Appl. No.: 17/356,228

(22) Filed: Jun. 23, 2021

(65) Prior Publication Data

US 2022/0098749 A1 Mar. 31, 2022

(30) Foreign Application Priority Data

Sep. 29, 2020 (JP) .............................. JP2020-163755

(51) Int. Cl.
| | | |
|---|---|---|
| C25D 17/00 | (2006.01) | |
| H01R 13/52 | (2006.01) | |
| H01R 4/34 | (2006.01) | |
| H01R 4/36 | (2006.01) | |
| H01R 4/44 | (2006.01) | |
| C25D 17/06 | (2006.01) | |

(Continued)

(52) U.S. Cl.
CPC ......... *C25D 17/005* (2013.01); *C25D 17/004* (2013.01); *C25D 17/06* (2013.01); *H01R 4/34* (2013.01); *H01R 4/36* (2013.01); *H01R 4/44* (2013.01); *H01R 13/22* (2013.01); *H01R 13/521* (2013.01); *H01R 12/714* (2013.01)

(58) Field of Classification Search
None
See application file for complete search history.

(56) References Cited

U.S. PATENT DOCUMENTS 6,139,712 A * 10/2000 Patton ..................... C25D 7/123
  205/137
7,601,248 B2 * 10/2009 Yoshioka .......... H01L 21/67126
  204/297.06

(Continued)

FOREIGN PATENT DOCUMENTS

| JP | H07-054199 A | 2/1995 |
| JP | H08-013198 A | 1/1996 |
| JP | 2000-219998 A | 8/2000 |

*Primary Examiner* — Stefanie S Wittenberg
(74) *Attorney, Agent, or Firm* — BakerHostetler

(57) ABSTRACT

There is provided a contact structure, comprising a substrate contact including a first contact portion that is located on a leading end side of the substrate contact and that comes into contact with a substrate and a second contact portion that is located nearer to a base end side of the substrate contact than the first contact portion; a seal member configured to cover a periphery of the substrate contact and to have a sealing surface that comes into contact with the substrate to seal the substrate contact; a first pressing portion configured to elastically apply a contact pressure on the substrate to the substrate contact; and a second pressing portion configured to come into contact with the seal member and to apply a contact pressure on the substrate to the seal member independently of the first pressing portion, wherein the first contact portion adheres to the seal member, and the second contact portion is fit in the seal member to be displaceable relative to the seal member.

21 Claims, 20 Drawing Sheets

(51) Int. Cl.
*H01R 13/22* (2006.01)
*H01R 12/71* (2011.01)

(56) References Cited

U.S. PATENT DOCUMENTS

| | | | | |
|---|---|---|---|---|
| 8,864,965 | B2* | 10/2014 | Fujikata | C25D 17/001 269/134 |
| 9,714,476 | B2* | 7/2017 | Yoshioka | H01L 21/68721 |
| 2018/0016698 | A1* | 1/2018 | Miyamoto | H01L 21/68728 |

* cited by examiner

CONTACT STRUCTURE, SUBSTRATE HOLDER, APPARATUS FOR PLATING, AND METHOD OF FEEDING ELECTRIC POWER TO SUBSTRATE

TECHNICAL FIELD

The present disclosure relates to a contact structure configured to feed electric power to a substrate, a substrate holder, an apparatus for plating, and a method of feeding electric power to a substrate.

BACKGROUND ART

A general procedure forms wirings, bumps (salient electrodes) and the like on the surface of a substrate such as a semiconductor wafer or a printed circuit board. An electroplating technique is known as a method of forming such wirings, bumps and the like. A plating apparatus employed for the electroplating technique is provided with a substrate holder that is configured to seal an end face of a circular or polygonal substrate and hold the substrate with a surface to be plated (a plating surface) of the substrate exposed. A procedure of plating the surface of a substrate by such a plating apparatus soaks the substrate holder with the substrate held thereby into a plating solution. A seed layer for power distribution formed on the surface of the substrate tends to be thinned, accompanied with a recent size reduction of a circuit line width. When the seed layer is thinned (for example, to about 1 μm or less) and the periphery of an electrical contact (contact) becomes wet, the flow of shunt current (bipolar current) in the seed layer and/or the occurrence of etching (galvanic corrosion due to a dissolved oxygen concentration gradient) in the vicinity of a gas liquid interface may cause dissolution of the seed layer. The dissolution of the seed layer results in inappropriate plating. It is accordingly necessary to keep at least the periphery of the electrical contact dried.

A variety of contact structures have been proposed to suppress or prevent a substrate contact from being exposed to and coming into contact with a plating solution. Japanese Unexamined Patent Publication No. H08-13198 (Patent Document 1) describes a configuration that a substrate contact in a cylindrical shape is covered with a fluoro-rubber cover and that the cover is provided with a hollow conical portion that is protruded from a leading end of the contact to be expanded. In this configuration, when the substrate contact comes into contact with a substrate, the hollow conical portion of the cover is pressed against and closely adheres to the substrate, and a contact surface of the contact is sealed and placed in an internal space of the hollow conical portion. Japanese Unexamined Patent Publication No. H07-54199 (Patent Document 2) describes a configuration of a contact in a claw shape formed by folding a leading end side of an elastic piece. In this configuration, the elastic piece is covered with an insulating tape, and an adhesive is applied on the claw, so that the contact other than a contact location is shielded by an insulating body. Japanese Unexamined Patent Publication No. 2000-219998 (Patent Document 3) describes a configuration of a contact including an electrically conductive support portion in a plate-like shape or in a rod-like shape and an electrically conductive contact portion provided on a leading end of the support portion. In this configuration, the contact other than the contact portion is covered with an insulating cover. In this configuration, the insulating cover seals a contact location between the contact and a substrate.

RELATED ART DOCUMENT

Patent Document

Patent Document 1: Japanese Unexamined Patent Publication No. H08-13198
Patent Document 2: Japanese Unexamined Patent Publication No. H07-54199
Patent Document 3: Japanese Unexamined Patent Publication No. 2000-219998

SUMMARY OF INVENTION

The configuration of providing the elastically deforming hollow conical portion like Patent Document 1 causes a difficulty in generating a strong sealing force. Another problem is a large area on the substrate covered with the sealing structure. The configurations that the contact is integrated with the sealing structure like Patent Document 2 and Patent Document 3, on the other hand, do not provide the structure of maintaining a sealing force. These configurations also fail to provide a sufficient sealing force. Any of the configurations of Patent Document 1 to Patent Document 3 accordingly has a difficulty in preventing dissolution of the seed layer.

An object of the present disclosure is to solve at least part of the problems described above.

According to one aspect of the present disclosure, there is provided a contact structure, comprising a substrate contact including a first contact portion that is located on a leading end side of the substrate contact and that comes into contact with a substrate and a second contact portion that is located nearer to a base end side of the substrate contact than the first contact portion; a seal member configured to cover a periphery of the substrate contact and to have a sealing surface that comes into contact with the substrate to seal the substrate contact; a first pressing portion configured to elastically apply a contact pressure on the substrate to the substrate contact; and a second pressing portion configured to come into contact with the seal member and to apply a contact pressure on the substrate to the seal member independently of the first pressing portion, wherein the first contact portion adheres to the seal member, and the second contact portion is fit in the seal member to be displaceable relative to the seal member.

DESCRIPTION OF EMBODIMENTS

The following describes embodiments of an apparatus for plating and a substrate holder used in the apparatus for plating according to the present disclosure with reference to attached drawings. In the attached drawings, identical or similar components are expressed by identical or similar reference signs. In the explanation of the respective embodiments, overlapping description with regard to the identical or similar components may be omitted. Characteristics and features described in each of the embodiments are applicable to the other embodiments so far as they are not incompatible with each other.

In the description hereof, the term "substrate" includes not only semiconductor substrates, glass substrates, liquid crystal substrates and printed circuit boards but magnetic recording media, magnetic recording sensors, mirrors, optical elements, micromachine elements or partially manufactured integrated circuits, and any other objects to be processed. The substrate may be in any of various shapes including polygonal shapes and circular shapes. Although the expressions such as "front face". "back face", "front", "back", "upper (above)", "lower (below)", "left" and "right" are used in the description hereof, these expressions only indicate the positions and the directions on the sheet surfaces of the illustrative drawings for the purpose of explanation and may be different from the positions and the directions in the actual layout, for example, during use of the apparatus.

Figure 1:
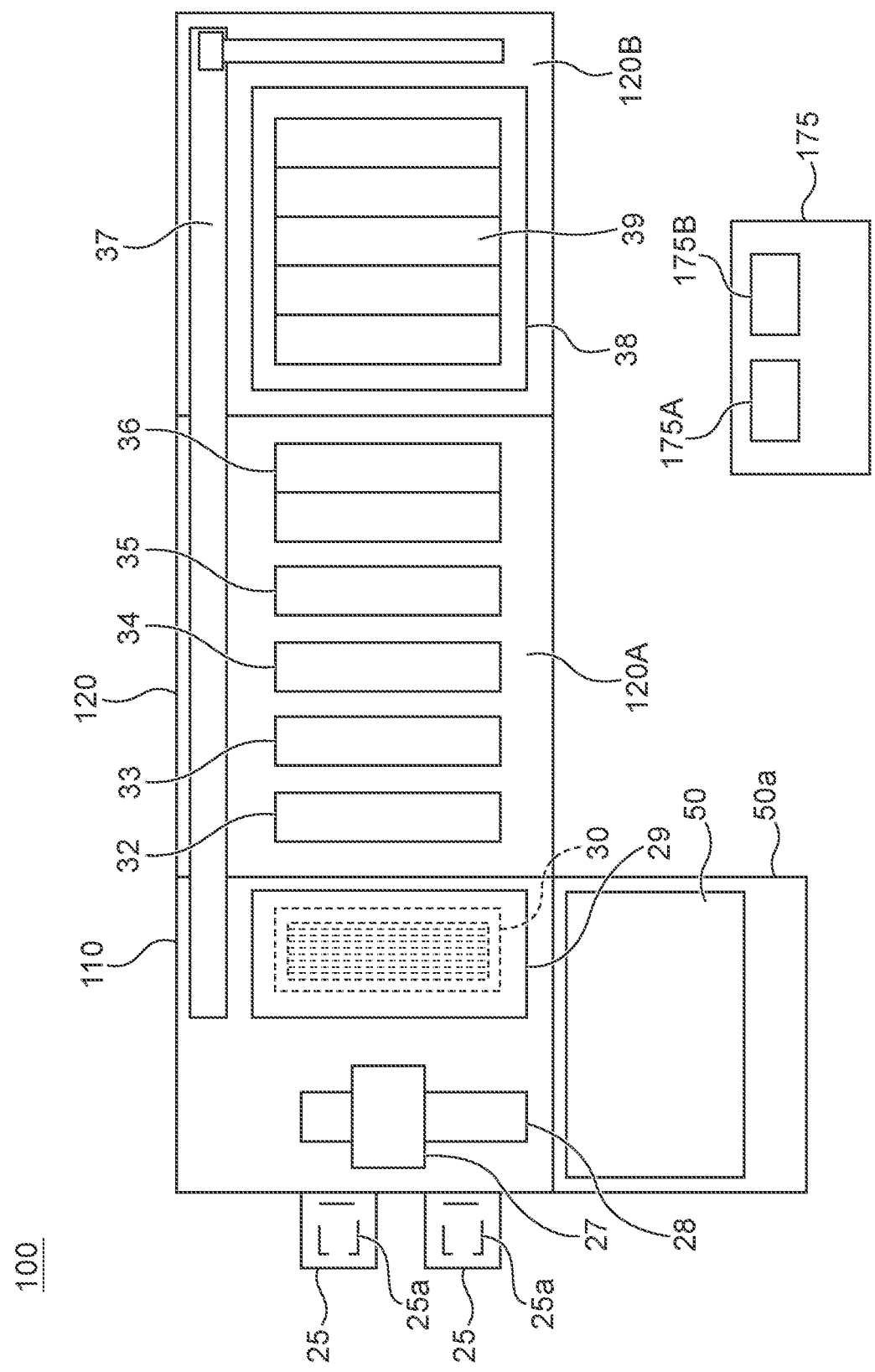
FIG. 1 is a general layout drawing illustrating a plating apparatus with a substrate holder according to one embodiment of the present disclosure used therefor.

FIG. 1 is a general layout drawing illustrating a plating apparatus with a substrate holder used therein according to one embodiment of the present disclosure. A plating apparatus 100 is configured to plate a substrate in such a state that the substrate is held by a substrate holder 200 (shown in FIG. 2). The plating apparatus 100 is roughly divided into a load/unload module 110 configured to load the substrate to the substrate holder 200 or unload the substrate from the substrate holder 200, a processing module 120 configured to process the substrate, and a cleaning module 50a. The processing module 120 further includes a pre-process/post-process module 120A configured to perform pre-process and post-process of the substrate and a plating module 120B configured to perform a plating process of the substrate.

The load/unload module 110 includes two cassette tables 25 and a substrate mounting/demounting mechanism 29. The cassette table 25 is configured to mount thereon a cassette 25a with the substrate received therein. The substrate mounting/demounting mechanism 29 is configured to attach and detach the substrate to and from the substrate holder 200. A stocker 30 is provided in a neighborhood of (for example, below) the substrate mounting/demounting mechanism 29 to place the substrate holders 200 therein. The cleaning module 50a includes a cleaning device 50 configured to clean and dry the substrate after the plating process.

A substrate transporter 27 is placed at a location surrounded by the cassette tables 25, the substrate mounting/demounting mechanism 29 and the cleaning module 50a, and is configured by a carrier robot to transfer or convey the substrate between these components. The substrate transporter 27 is configured to be movable by a moving device or mechanism 28. For example, the substrate transporter 27 is configured to take out a substrate prior to plating from the cassette 25a and transfer the substrate to the substrate mounting/demounting mechanism 29, to receive a substrate after plating from the substrate mounting/demounting mechanism 29, to transfer the substrate after plating to the cleaning module 50a, and to take out a cleaned and dried substrate from the cleaning module 50a and place the cleaned and dried substrate into the cassette 25a.

The pre-process/post-process module 120A includes a pre-wet module 32, a pre-soak module 33, a pre-rinse module 34, a blow module 35 and a rinse module 36. The pre-wet module 32 serves to soak a substrate in pure water. The pre-soak module 33 serves to remove an oxide film on the surface of a conductive layer such as a seed layer formed on the surface of the substrate by etching. The pre-rinse module 34 serves to clean the pre-soaked substrate along with a substrate holder with a cleaning liquid (for example, pure water). The blow module 35 serves to drain the liquid from the cleaned substrate. The rinse module 36 serves to clean the plated substrate along with the substrate holder by using the cleaning liquid. This configuration is, however, only illustrative, and the pre-process/post-process module 120A is not limited to this configuration described above but may adopt another configuration.

The plating module 120B includes a plurality of plating devices (plating tanks or cells) 39, and an overflow tank 38. Each of the plating device 39 is configured to place one substrate inside thereof and to soak the substrate in a plating solution kept inside thereof and plate the surface of the substrate by copper plating or the like. The type of the plating solution is not specifically limited, but any of various plating solutions may be used according to the purposes.

The plating apparatus 100 includes a holder transporter 37 that is located on a side of these components and configured to transfer the substrate holder 200 along with the substrate between these components and that adopts, for example, a linear motor system. This holder transporter 37 is configured to transfer the substrate holder between the substrate mounting/demounting mechanism 29, the stocker 30, the pre-wet module 32, the pre-soak module 33, the pre-rinse module 34, the blow module 35, the rinse module 36 and the plating device 39.

The plating apparatus 100 having the configuration described above includes a controller 175 that serves a control module configured to control the respective components described above. The controller 175 includes a memory 175B configured to store predetermined programs and a CPU 175A configured to execute the programs stored in the memory 175B. A storage medium that constitutes the memory 175B is configured to store, for example, a variety of set data and various programs including a program to control the plating apparatus 100. The programs include, for example, programs that perform transfer control of the substrate transporter 27, mounting and demounting control of mounting and demounting the substrate to and from the substrate holder by the substrate mounting/demounting mechanism 29, transfer control of the holder transporter 37, control of the processings in the respective processing modules, control of the plating process in the respective plating device 39, and control of the cleaning module 50a. The storage medium may include nonvolatile and/or volatile storage media. The storage medium used may be any of known storage media, for example, a computer readable memory such as a ROM a RAM or a flash memory or a disk-type storage medium such as a hard disk, a CD-ROM, a DVD-ROM or a flexible disk.

The controller 175 is configured to make communication with a non-illustrated upper level controller that performs integrated control of the plating apparatus 100 and the other relevant devices and to send and receive data to and from a database of the upper level controller. Part or the entirety of the functions of the controller 175 may be configured by a hardware such as ASIC. Part or the entirety of the functions of the controller 175 may be configured by a sequencer. Part or the entirety of the controller 175 may be placed on inside and/or outside of a housing of the plating apparatus 100. Part or the entirety of the controller 175 is connected to make communication with the respective components of the plating apparatus 100 by wire or wirelessly.

(Substrate Holder)

Figure 2:
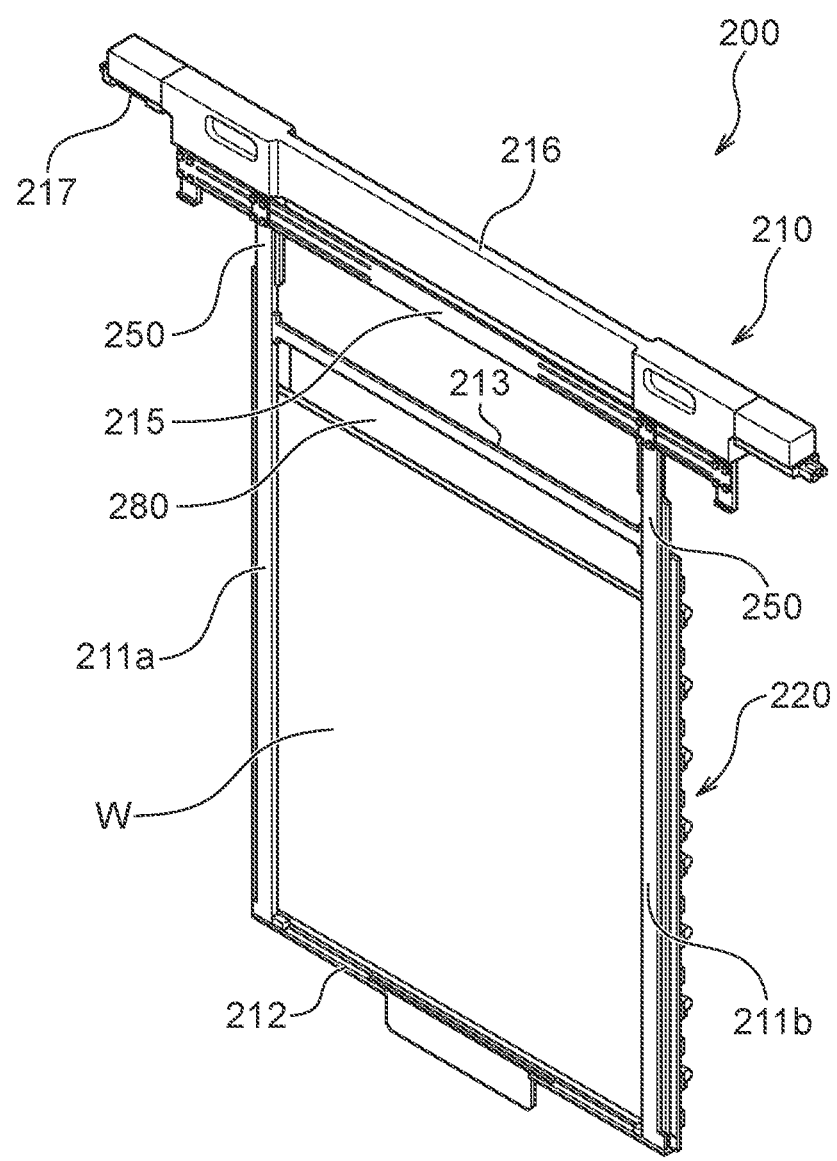
FIG. 2 is a perspective view illustrating the substrate holder viewed from a front face side thereof.
Figure 3:
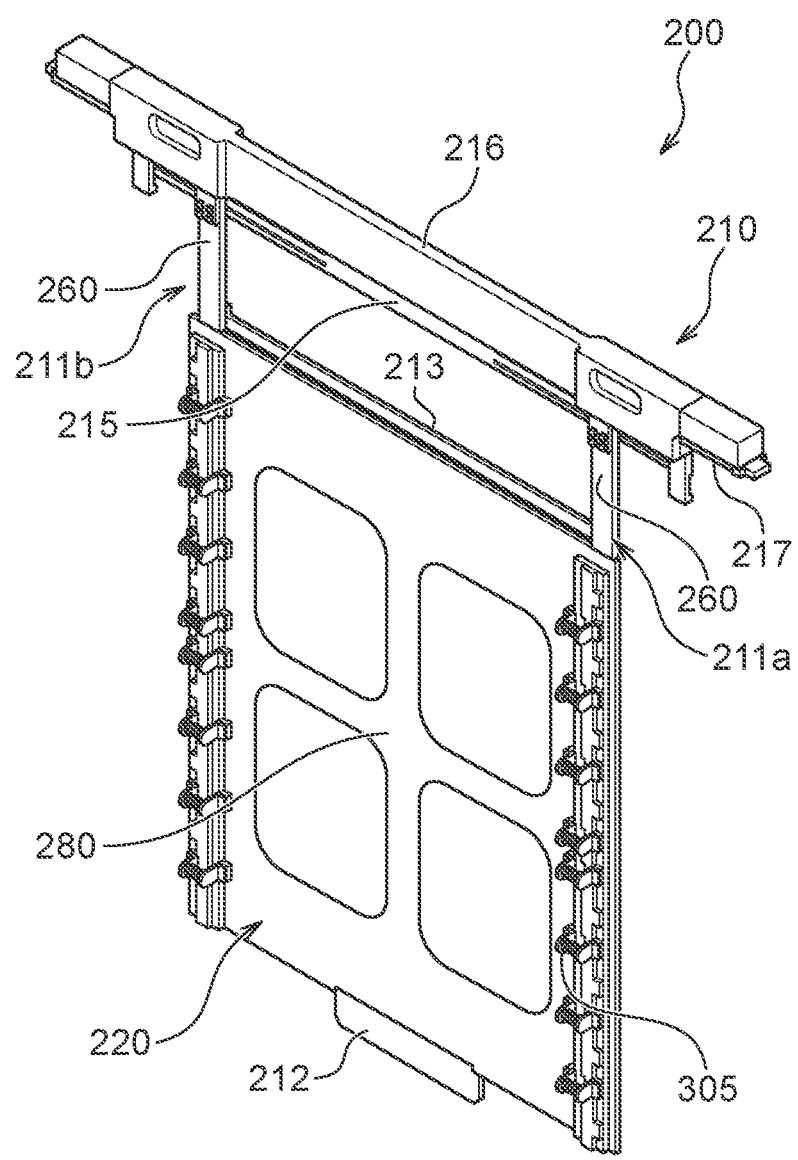
FIG. 3 is a perspective view illustrating the substrate holder viewed from a back face side thereof.
Figure 4:
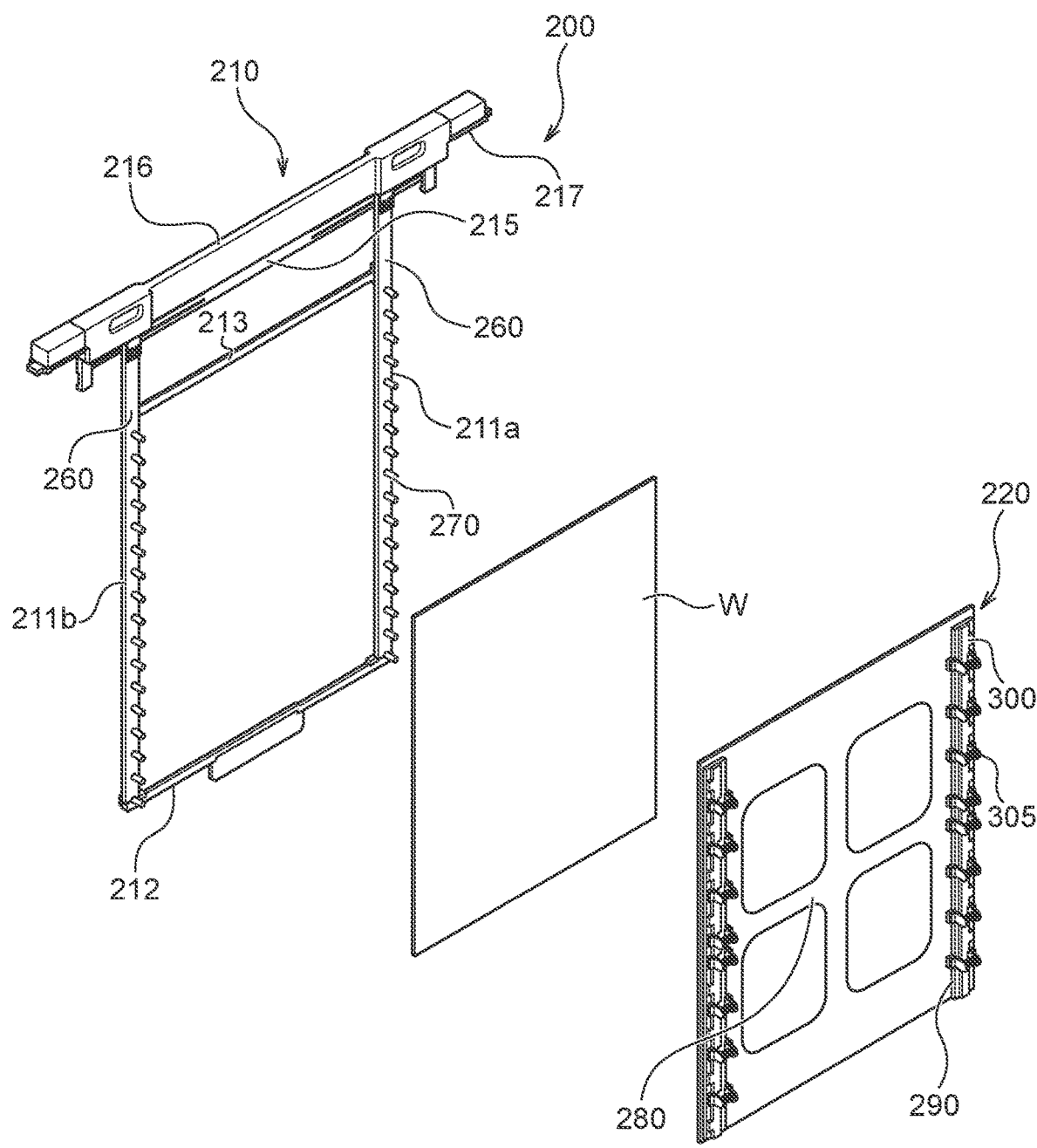
FIG. 4 is a perspective view illustrating the substrate holder in such a state that respective holding members are separated.
Figure 5:
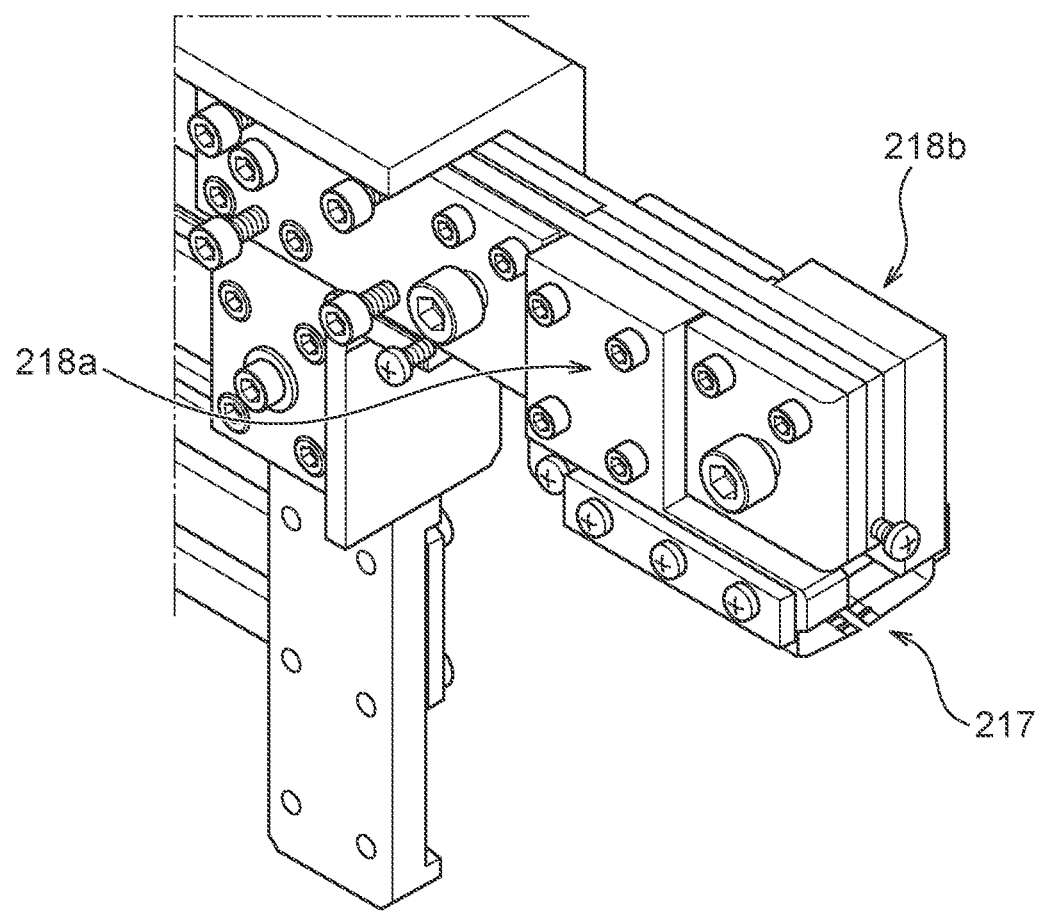
FIG. 5 is an enlarged perspective view illustrating an external connecting portion of the substrate holder.

FIG. 2 is a perspective view illustrating the substrate holder viewed from a front face side. FIG. 3 is a perspective view illustrating the substrate holder viewed from a back face side. FIG. 4 is a perspective view illustrating the substrate holder in such a state that respective holding members are separated. FIG. 5 is an enlarged perspective view illustrating an external connecting portion of the substrate holder. This substrate holder 200 includes a first holding member 210 and a second holding member 220 and holds a substrate W in such a state that the first holding member 210 and the second holding member 220 are engaged with each other and that the substrate W is placed between the first holding member 210 and the second holding member 220.

The first holding member 210 includes a longitudinal member 211a, a longitudinal member 211b, a transverse member 212, a transverse member 213, a rail 215, an arm 216, and an external connecting portion 217. The first holding member 210 also includes a plurality of pins 270 (shown in FIG. 4) serving as a locking mechanism to lock the first holding member 210 to the second holding member 220. The longitudinal member 211a and the longitudinal member 211b are extended approximately parallel to each other and respectively have a power feed device including substrate contacts (described later) serving as an electric contact that comes into contact with a front face of the substrate W to make the flow of electric current. This embodiment illustrates a configuration that only the longitudinal member 211a and the longitudinal member 211b are provided with the power feed devices. According to another embodiment, the transverse member 212 and/or the transverse member 213 may be provided with power feed devices, in place of or in addition to the longitudinal member 211a and/or the longitudinal member 211b. The transverse member 212 is configured to link the longitudinal member 211a and the longitudinal member 211b with each other on a side farther from the arm 216. The transverse member 213 is configured to link the longitudinal member 211a and the longitudinal member 211b with each other on a side nearer to the arm 216. The transverse members 212 and 213 serve to support the longitudinal members 211a and 211b and suppress deflection. The front face of the substrate W is exposed in an area surrounded by these longitudinal members 211a and 211b and transverse members 212 and 213. According to a modification, the substrate holder may be formed in a portal shape with omission of the transverse members 212 and 213.

The rail 215 is mounted approximately parallel to the arm 216. The longitudinal members 211a and 211b are mounted to be slidable along the rail 215. The rail 215 is configured such that the positions of the longitudinal members 211a and 211b are adjustable according to the dimensions of the substrate W by moving the longitudinal members 211a and 211b along the rail 215 to become closer to each other or to become away from each other.

The arm 216 is a grip portion held by the holder transporter 37 and serves as a part that is supported when the substrate holder is placed in each of the processing modules or tanks. The arm 216 is extended approximately perpendicular to the longitudinal member 211a, and the external connecting portion 217 is provided on one end of the arm 216. According to another embodiment, the external connecting portions 217 may be provided on respective ends of the arm 216. The external connecting portion 217 is an external connection terminal used to electrically connect the substrate holder 200 with an external power source and includes a plurality of externally connecting contacts configured by, for example, leaf electrodes (as shown in FIG. 5). Part of the externally connecting contacts (on a front side of FIG. 5) is electrically connected with a bus bar 218a, whereas another part of the externally connecting contacts (on a back side of FIG. 5) is electrically connected with a bus bar 218b. The bus bars 218a and 218b may be appropriately covered with a cover or a protective member. The bus bar 218a is extended along a longitudinal direction of the arm 216 and is configured to be mechanically and electrically connected with a bus bar 260 of the longitudinal member 211a (shown in FIG. 3). The bus bar 218a is configured to be connectable with the bus bar 260 of the longitudinal member 211a at a plurality of positions according to adjustment of the position of the longitudinal member 211a. The bus bar 218b is extended along the longitudinal direction of the arm 216 and is configured to be mechanically and electrically connected with a bus bar 260 of the longitudinal member 211b (shown in FIG. 3). The bus bar 218b is configured to be connectable with the bus bar 260 of the longitudinal member 211b at a plurality of positions according to adjustment of the position of the longitudinal member 211b. In one example, the connecting positions of the bus bars 218a and 218b with the bus bars 260 of the longitudinal members 211a and 211b are placed inside of the cover or the protective member.

The second holding member 220 has a back plate 280 and a locking mechanism including lock plates 300 that are provided on the back plate 280 and that serve to lock the second holding member 220 on the first holding member 210. The locking mechanism includes the lock plates 300 extended corresponding to the longitudinal members 211a and 211b, float plates 290 placed between the back plate 280 and the lock plates 300 and extended corresponding to the lock plates 300, and biasing mechanisms 305 configured to generate a biasing force between the lock plates 300 and the float plates 290. The details of the locking mechanism will be described later.

(Power Feed Module)

Figure 6:
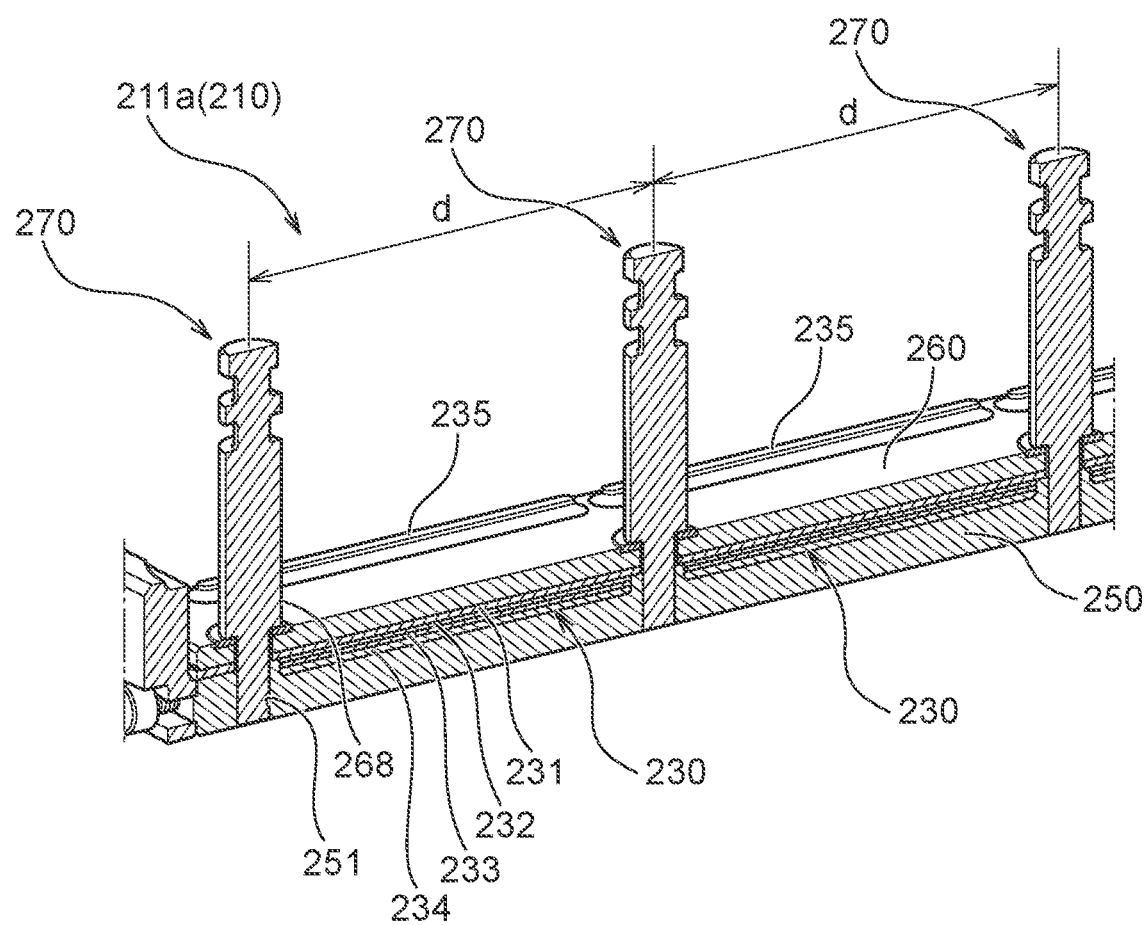
FIG. 6 is a longitudinal sectional view illustrating a longitudinal member.

FIG. 6 is a longitudinal sectional view illustrating the longitudinal member. The longitudinal member 211a and the longitudinal member 211b have similar configurations. The following accordingly describes the longitudinal member 211a as an example. As illustrated, the longitudinal member 211a includes a front plate 250, the bus bar 260, a plurality of power feed modules 230 that are electrically connected with the bus bar 260, and a plurality of pins 270 that are placed on respective sides of each of the power feed modules 230 (between adjacent power feed modules 230 and outside of power feed modules 230 on respective ends). In FIG. 6, an interval between adjacent pins 270 is expressed by d. As shown in FIG. 3 and FIG. 4, the bus bar 260 is extended over the full length of the longitudinal member 211a and is configured to be mechanically connected with the rail 215 and to be mechanically and electrically connected with the bus bars 218a and 218b in the arm 216 (shown in FIG. 5) as described above. The bus bar 260 is electrically connected with the external connecting portion 217 via the bus bars 218a and 218b in the arm 216. As shown in FIG. 2 and FIG. 6, the front plate 250 is provided on a front face side of the bus bar 260 and is extended along the bus bar 260 over the full length of the longitudinal member 211a. The front plate 250 cooperates with a seal member 231 to shield substrate contacts 236 and a contact plate 233 from the plating solution. The power feed modules 230 are power feed units that configure the power feed device and are respectively placed on the front face side of the bus bar 260 along the longitudinal member 211a as shown in FIG. 6. In this embodiment, the power feed modules 230 are placed between the bus bar 260 and the front plate 250. As described later with reference to FIG. 7, each of the power feed modules 230 has substrate contacts 236 and is arranged such that leading end sides of the substrate contacts 236 are extended across a through hole 263 of the bus bar 260 to a back face side of the bus bar 260 (a side opposite to the front plate 250) to come into contact with the substrate W.

Figure 7:
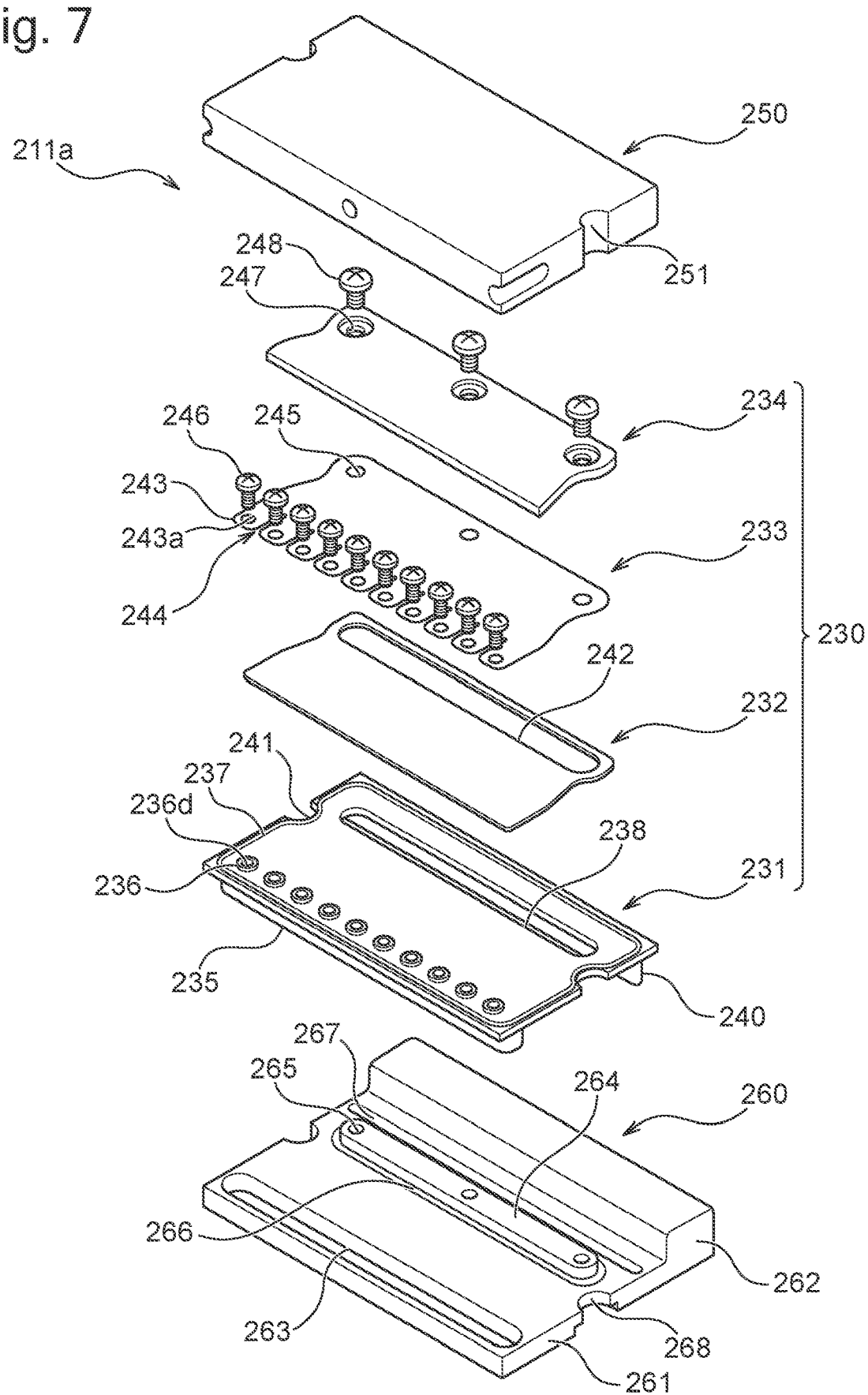
FIG. 7 is an exploded perspective view illustrating the longitudinal member.
Figure 8:
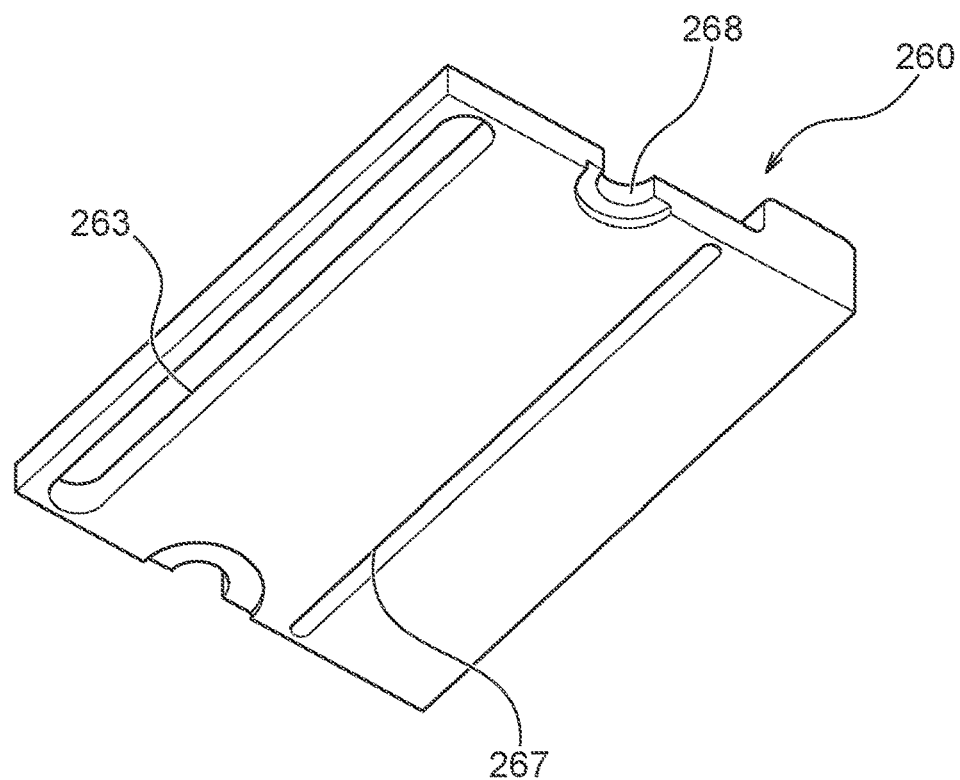
FIG. 8 is a perspective view illustrating a bus bar viewed from a back face side thereof corresponding to one unit length of a power feed module.
Figure 9:
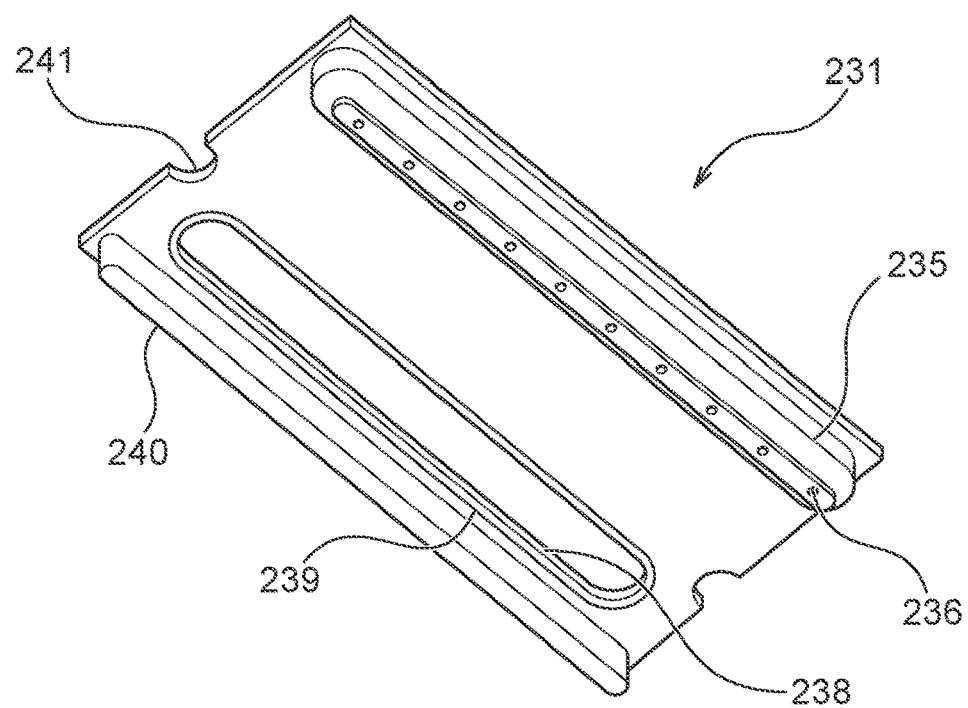
FIG. 9 is a perspective view illustrating a seal member viewed from a back face side thereof.
Figure 10:
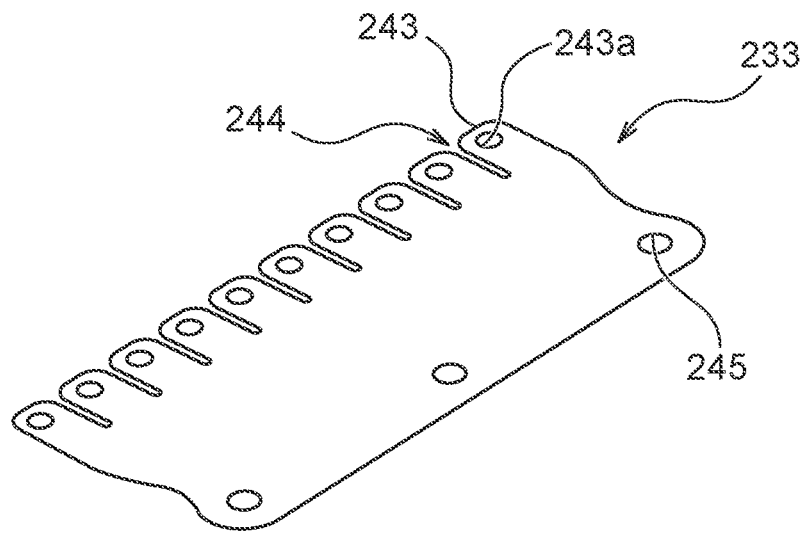
FIG. 10 is a perspective view illustrating a contact plate viewed from a back face side thereof.
Figure 11:
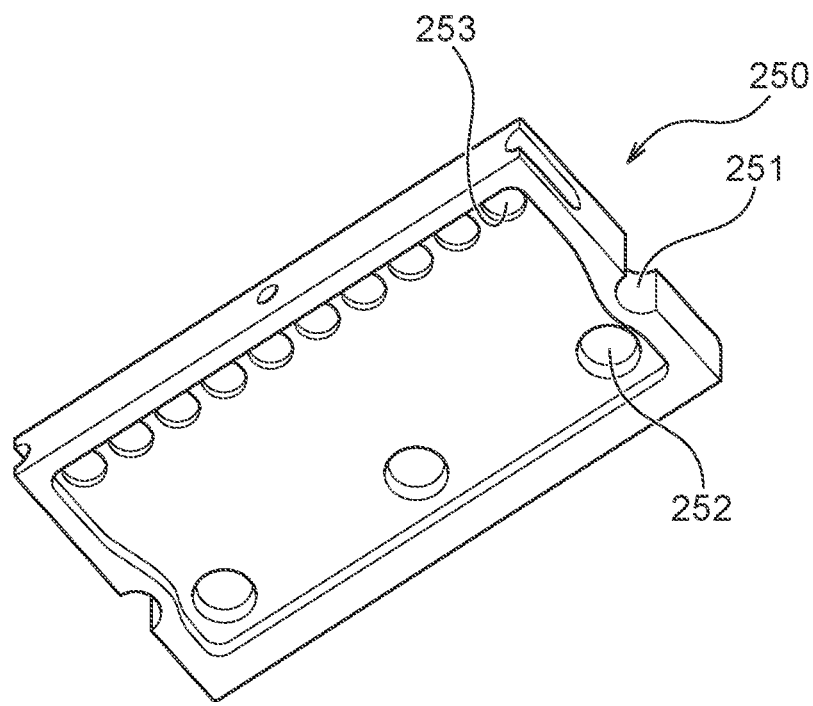
FIG. 11 is a perspective view illustrating a front plate viewed from a back face side corresponding to one unit length of the power feed module.
Figure 12:
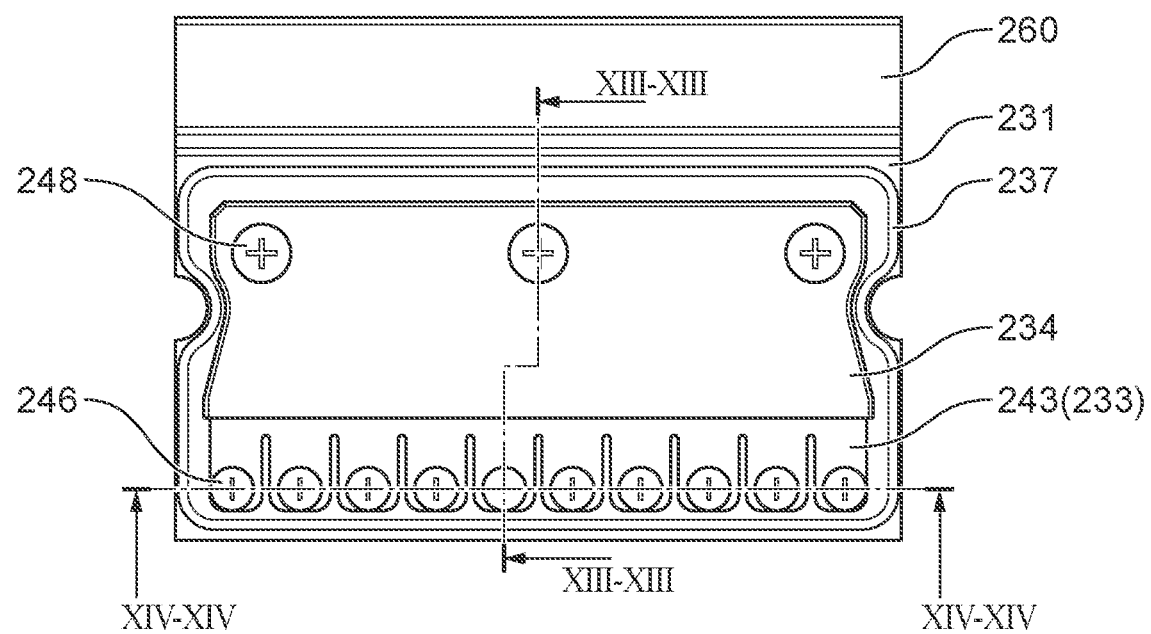
FIG. 12 is a plan view illustrating close-up of the periphery of the power feed module.
Figure 13:
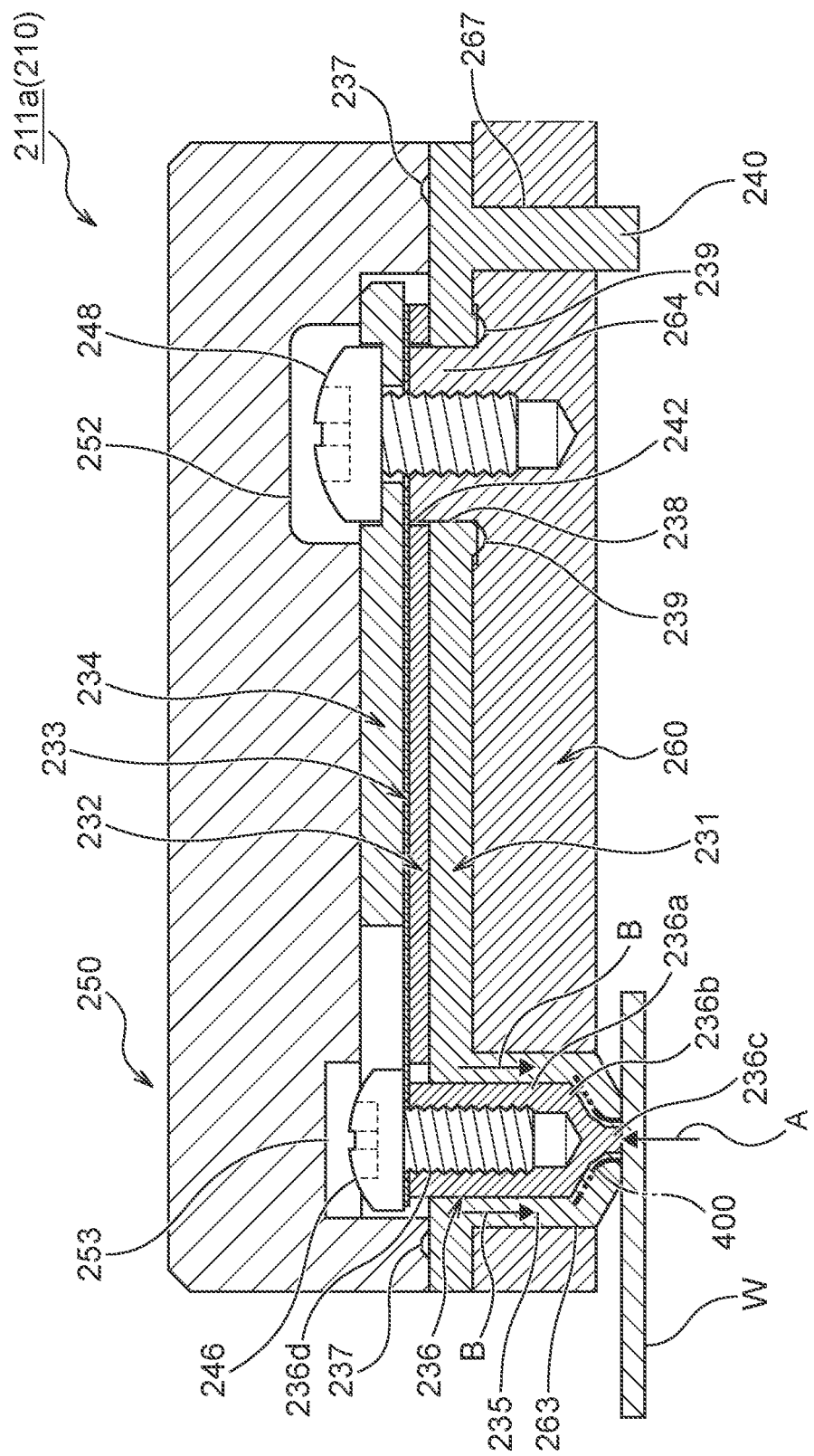
FIG. 13 is a sectional view illustrating the power feed module taken along a line XIII-XIII in FIG. 12.
Figure 14:
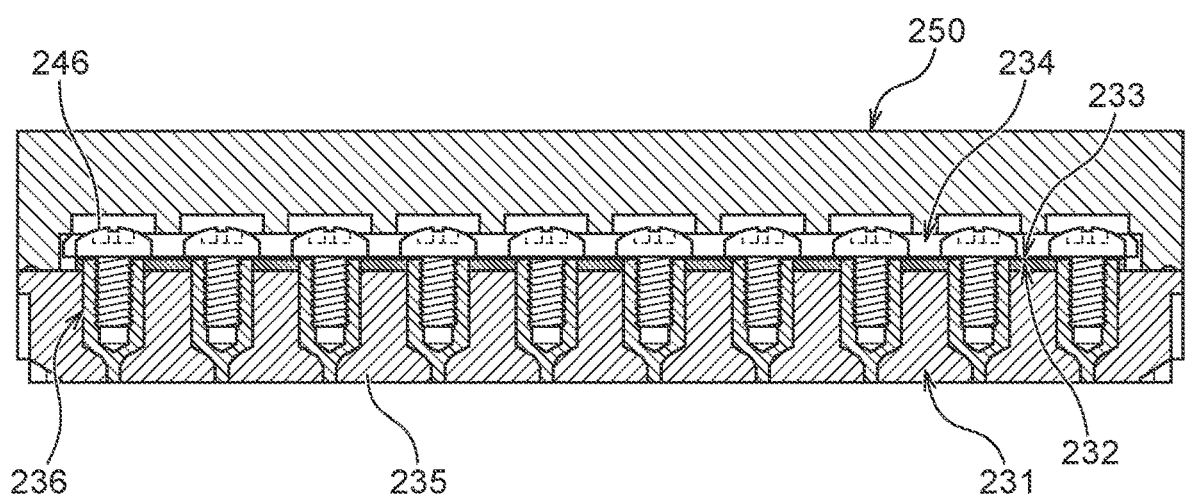
FIG. 14 is a sectional view illustrating the power feed module taken along a line XIV-XIV in FIG. 12.
Figure 15:
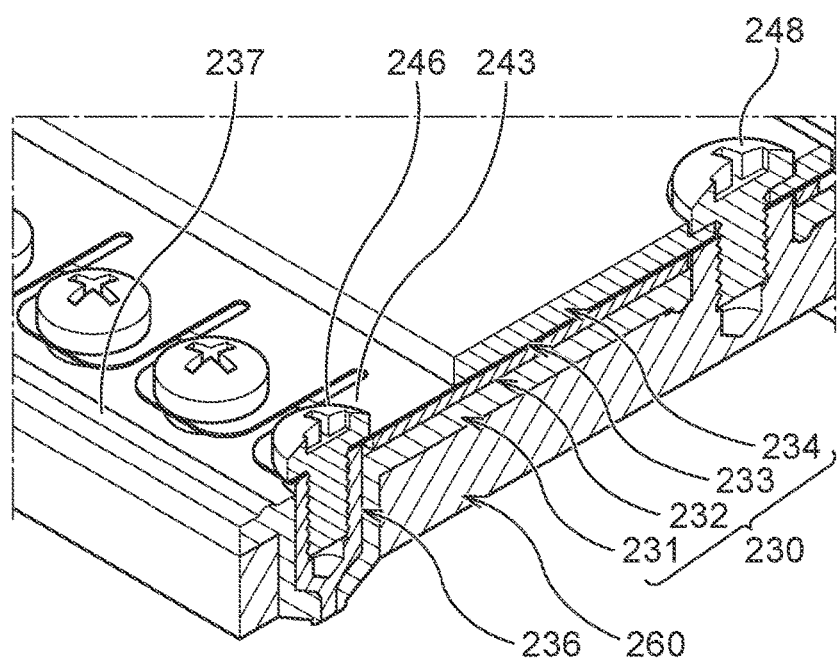
FIG. 15 is a sectional perspective view illustrating the power feed module.

FIG. 7 is an exploded perspective view illustrating the longitudinal member. FIG. 8 is a perspective view illustrating the bus bar viewed from a back face side thereof corresponding to one unit length of the power feed module. FIG. 9 is a perspective view illustrating the seal member viewed from a back face side thereof. FIG. 10 is a perspective view illustrating the contact plate viewed from a back face side thereof. FIG. 11 is a perspective view illustrating the front plate viewed from a back face side thereof corresponding to one unit length of the power feed module. FIG. 12 is a plan view illustrating close-up of the periphery of the power feed module. FIG. 13 is a sectional view illustrating the power feed module taken along a line XIII-XIII in FIG. 12. FIG. 14 is a sectional view illustrating the power feed module taken along a line XIV-XIV in FIG. 12. FIG. 15 is a sectional perspective view illustrating the power feed module. As shown in FIG. 6, the front plate 250 and the bus bar 260 are extended over the full length of the longitudinal member 211a. In FIG. 7, FIG. 8 and FIG. 11, however, only portions corresponding to one power feed module 230 (one unit length of the power feed module) are illustrated with a view to avoiding the complication of illustration. In the description hereof, the power feed module may be referred to as the contact seal module.

The power feed module 230 includes the seal member 231, the substrate contacts 236 placed in the seal member 231, a retainer plate (support plate) 232, the contact plate 233, and a contact plate retainer (pressing plate) 234. As shown in FIG. 15, the power feed module 230 is configured such that the substrate contacts 236 surrounded by a seal portion receive a supply of electric power from the bus bar 260 via the contact plate 233, that the contact plate 233 cantilever-supported by the bus bar 260 elastically applies a contact pressure on the substrate to the substrate contacts 236, and that the retainer plate 232 applies a contact pressure on the substrate (sealing pressure) to the seal portion 235. In the description below, the "contact pressure on the substrate" may be simply referred to as "contact pressure".

The seal member 231 is an elastic member (made of an elastomer such as rubber) having an approximately rectangular shape and includes the seal portion 235 configured to receive the substrate contacts 236 therein, a seal portion 237 provided on a front face side (on an upper face in FIG. 7) of the seal member 231, a through hole 238 provided outside of the seal portion 235, a seal portion 239 provided around the through hole 238 on a back face side of the seal member 231 (shown in FIG. 9), a protrusion 240 provided outside of the through hole 238 on the back face side of the seal member 231 (shown in FIG. 9), and cuts 241 configured to receive the pins 270. The substrate contacts 236 are provided to penetrate through the seal portion 235 from its front face side to its back face side as shown in FIGS. 13 to 15.

As shown in FIG. 13, the seal portion 235 is made to pass through the through hole 263 of the bus bar 260 and is exposed on a back face side of the longitudinal member 211a (on a lower side of this drawing). The seal portion 235 is fit in the through hole 263 to be movable relative to the bus bar 260. The seal portion 235 is formed in such a length as to be protruded by a predetermined length from a back face of the bus bar 260. The seal portion 235 is tapered to decrease the diameter toward a leading end face thereof (sealing surface). This configuration enables a contact range of the seal portion 235 (sealing surface) that is in contact with the substrate to be adjusted to a desired range and prevents a residual part of the seal portion 235 other than the desired range from coming into contact with the substrate. Furthermore, the configuration of tapering the seal portion 235 and adjusting the contact range avoids an abrupt shape change of the seal member and readily ensures the fluidity of rubber in the process of molding the seal member.

As shown in FIG. 7 and FIG. 14, a plurality of the substrate contacts 236 are provided in the seal portion 235 to penetrate through the seal member 231 from its front face side to its back face side. The plurality of substrate contacts 236 are provided to be arrayed in the vicinity of an inner side and along the inner side of the seal member 231. The substrate contacts 236 and the seal portion 235 are combined with each other in a concave-convex manner or the like such that the positional relationship between the substrate contacts 236 and the leading end of the seal portion 235 is determined unequivocally (shown in FIG. 13 to FIG. 15). The plurality of substrate contacts 236 are mounted to the contact plate 233 by, for example, screws 246. As shown in FIG. 13, the substrate contact 236 is arranged such that a base end of the substrate contact 236 (a large diameter portion 236a) is protruded from a front face of the seal portion 235 by a predetermined distance and that a leading end of the substrate contact 236 (a small diameter portion 236c) is practically flush with (flat with) a leading end face of the seal portion 235 (sealing surface). The arrangement that the leading end face of the substrate contact 236 is flush with the leading end face of the seal portion 235 suppresses/prevents the liquid from remaining at the leading end of the substrate contact 236. The configuration that the leading end of the substrate contact 236 (the small diameter portion 236c) is practically flush with (flat with) the leading end face of the seal portion 235 (sealing surface) is, however, not essential. A configuration that the leading end of the substrate contact 236 (the small diameter portion 236c) is retreated from the leading end face of the seal portion 235 (sealing surface) or a configuration that the leading end of the substrate contact 236 (the small diameter portion 236c) is protruded from the leading end face of the seal portion 235 is also employable.

The substrate contact 236 is an electrically conductive member and may be made of, for example, SUS. The substrate contact 236 has a block pin configuration and is in a cylindrical shape according to the embodiment. The substrate contact 236 may, however, be in any shape other than the cylindrical shape. The substrate contact 236 includes the large diameter portion 236a, the small diameter portion 236c and a tapered portion 236b configured to connect the large diameter portion 236a with the small diameter portion 236c. A leading end side of the substrate contact 236 adheres to the seal member 231 (the seal portion 235), while a base end side of the substrate contact 236 does not adhere to the seal member 231 (the seal portion 235) but is fit to be movable relative to the seal member 231 (the seal portion 235). The term "adhering" herein includes adhering in the process of an integral molding with a rubber, a resin or the like, adhering by an adhesive, adhering by welding and other adhering. An adhering range and a non-adhering range are determined such as to enable a sealing pressure (sealing force) to be generated by the action that causes the substrate contact 236 to be displaced in an opposite direction to a contact pressure (in an opposite direction to a substrate) by an acting force received from a substrate side and that causes the sealing surface of the seal portion 235 to remain, when the substrate is held by a substrate holder.

In the illustrated example of FIG. 13, the small diameter portion 236c and the tapered portion 236b adhere to the seal member 231 by cross-linking adhesion in the process of vulcanization molding (an adhesive area 400 is shown by the two-dot chain line in this drawing). The large diameter portion 236a, on the other hand, does not adhere to the seal member 231 but is fit to be movable relative to the seal member 231 (the seal portion 235). The configuration that the leading end side of the substrate contact 236 adheres to the seal portion 235 and that the base end side of the substrate contact 236 does not adhere to the seal portion 235 may be implemented, for example, by simply not applying an adhesive (a chemical that achieves adhesion of the rubber) or by applying a chemical that prevents adhesion of the rubber (for example, a release agent) in a non-adhering part of the substrate contact 236, and/or, by applying a chemical that achieves adhesion of the rubber in an adhering part of the substrate contact 236 and then by performing vulcanization molding. In place of the integral molding, another employable technique may form the seal member 231 having holes provided to receive the substrate contacts 236 as a separate body and may cause the substrate contacts 236 to adhere to or to be welded to the seal member 231 by means of an adhesive or the like.

The large diameter portion 236a has a diameter that provides a contact area (power feed area) with the contact plate 233 and enables the substrate contact 236 to provide a strength that withstands high pressure from a rubber material in the process of integral molding the substrate contacts 236 with the seal member 231. Providing the large diameter portion 236a also has a secondary effect of forming a connection between a forming mold and the substrate contacts 236 in the forming mold (for example, a method of fixing the substrate contacts 236 to the forming mold). The large diameter portion 236a has a screw hole 236d in which the screw 246 is screwed to fix the contact plate 233 to the large diameter portion 236a.

The small diameter portion 236c has a smaller diameter than the large diameter portion 236a and has a shorter length than the large diameter portion 236a to ensure the rigidity. Additionally, the small diameter portion 236c is formed in such dimensions as to be suitable for an allocated area on the substrate W (contact allowable range), as well as for the leading end face of the seal portion 235 (sealing surface). The contact allowable range is set according to the specification of the substrate. Forming the substrate contact 236 in the tapered block pin shape has an additional advantage of providing an interval between a plurality of substrate contacts.

The tapered portion 236b is provided to suppress an abrupt change in dimensions of the substrate contact 236 and ensure the fluidity of rubber in the process of integral molding with the seal member 231. According to the embodiment, a corner between the tapered portion 236a and the small diameter portion 236c and a corner between the tapered portion 236b and the large diameter portion 236a are rounded, with a view to more reliably ensuring the fluidity of rubber.

According to the embodiment, the seal member 231 provided to hold the substrate contacts 236 is configured to cause the seal portion 235 to come into contact with a seed layer that is not coated with a resist on the substrate W. The configuration that brings the entire seal portion 235 provided to hold the substrate contacts 236, into contact with an identical height on the substrate enhances the sealing property of the substrate contacts 236 by the seal portion 235.

The seal portion 237 is provided along an outer circumferential part on a front face of the seal member 231 as shown in FIG. 7 and is configured to seal between the seal member 231 and the front plate 250 and protect the substrate contacts 236, the contact plate 233 and the like from a plating solution as shown in FIG. 13. The seal portion 237 may be a projection provided integrally with the seal member 231 or may be a separate member such as an O ring mounted to the seal member main body. The through hole 238 is provided on the outside of the seal portion 235 and is formed to penetrate from the front face side to the back face side. The shape and the dimensions of the through hole 238 may be any arbitrary shape and dimensions according to the shape and the dimensions of a projection 264 of the bus bar 260. For example, the through hole 238 may be formed in a long hole shape extended approximately parallel to the seal portion 235 as shown in FIG. 7. As shown in FIG. 13, the projection 264 of the bus bar 260 is provided to pass through the through hole 238, and an end face of the projection 264 of the bus bar 260 is exposed on the front face side of the substrate holder. It is preferable that the projection 264 of the bus bar 260 is protruded from a front face of the seal member 231 by a predetermined length to expose the end face of the projection 264, in order to facilitate the connection with the contact plate 233. As shown in FIG. 9 and FIG. 13, the seal portion 239 is provided around the through hole 238 on the back face of the seal member 231 and is configured to seal between the seal member 231 and the bus bar 260 around the projection 264 and protect the projection 264 and the contact plate 233 connected with the projection 264 from the plating solution. The seal portion 239 may be a projection provided integrally with the seal member 231 or may be a separate member such as an O ring mounted to the seal member main body.

As shown in FIG. 9 and FIG. 13, the protrusion 240 is provided to be protruded from the back face of the seal member 231 on the outside of the through hole 238. The protrusion 240 serves as a strut to come into contact with the second holding member 220 and also serves as a pressure receiver to receive the pressing force from the second holding member 220, when the substrate W is held by the substrate holder 200. The protrusion 240 serves in cooperation with the seal portion 235 as the pressure receiver to receive the pressing force from the second holding member 220, so that it is preferable that the protrusion 240 is formed to have the shape and the dimensions corresponding to those of the seal portion 235. For example, as shown in FIG. 7 and FIG. 9, the protrusion 240 is formed in an elongated shape to be extended approximately parallel to the seal portion 235 and to have approximately the same length to that of the seal portion 235. As shown in FIG. 13, the protrusion 240 is provided to pass through the through hole 267 of the bus bar 260 and is extended toward the second holding member 220 (not shown in this drawing) placed on the back face side. The protrusion 240 serves as a pressure receiver to come into contact with the second holding member 220 and to receive part of the pressing force of the second holding member 220 against the first holding member 210, when the substrate W is placed between the first holding member 210 and the second holding member 220.

As shown in FIG. 7 and FIG. 13, the retainer plate 232 is a member provided between the seal member 231 and the contact plate 233 to support the contact plate 233 and hold or press the seal member 231. The retainer plate 232 is made of, for example, SUS. The retainer plate 232 is formed to have the higher rigidity than that of the contact plate 233. In other words, the retainer plate 232 has such a rigidity as to be more unlikely to be displaced in a direction away from the substrate by a force received from the substrate side, compared with the contact plate 233. The retainer plate 232 is formed to have a thickness that is approximately equal to the height of the projection 264 of the bus bar 260 protruded from the seal member 231. The retainer plate 232 has a through hole 242 that is formed roughly corresponding to the through hole 238 of the seal member 231 and that is configured to cause the projection 264 of the bus bar 260 to pass through. The through hole 242 may be formed slightly larger than the through hole 238.

The retainer plate 232 presses the seal portion 235 against the substrate W and applies the contact pressure on the substrate W (the contact pressure on the substrate, the same applies hereinafter) to the seal portion 235, when the substrate contacts 236 are pressed against the substrate W. Such pressing by the retainer plate 232 causes the base end side of the seal portion 235 (a part corresponding to the large diameter portions 236a in this example) to be deformed/ displaced independently of the substrate contacts 236, while causing the leading end side of the seal portion 235 that adheres to the substrate contacts 236 (a part corresponding to the tapered portions 236b and the small diameter portions 236c in this example) to be pressed against the substrate W. According to the embodiment, the base end face of the seal member 231 is formed approximately parallel to the substrate, and the retainer plate 232 applies the contact pressure to the seal portion 235 via a plane approximately parallel to the sealing surface of the seal portion 235. This configuration applies a sufficient pressing force to the seal portion 235 and thereby applies a sufficient contact pressure to the sealing surface. According to the embodiment, the retainer plate 232 and the front plate 250 serve to apply the contact pressure to the seal portion 235.

Figure 16:
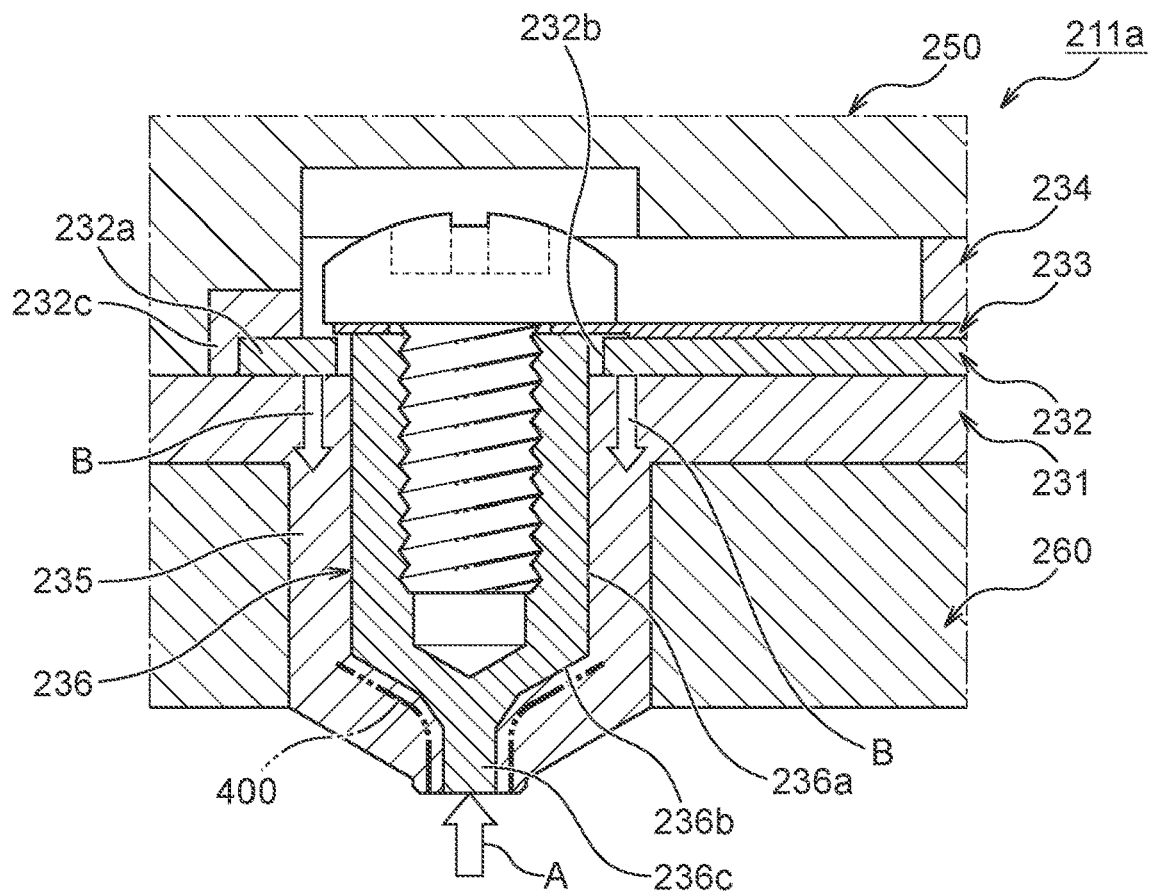
FIG. 16 is a sectional view illustrating a power feed module including a retainer plate of another configuration.
Figure 17:
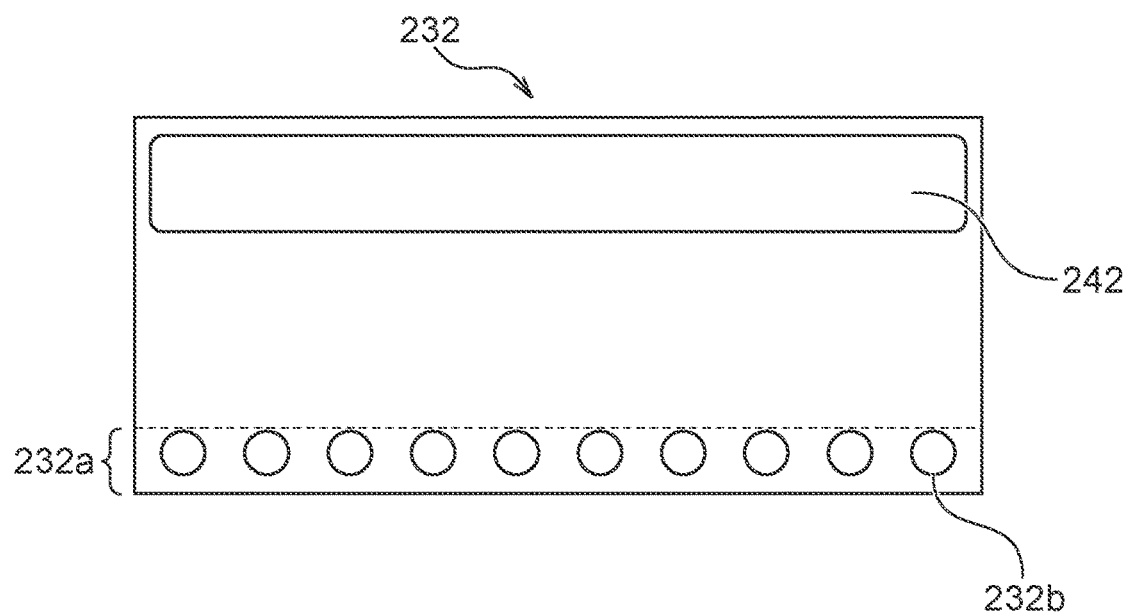
FIG. 17 is a plan view illustrating the retainer plate of another configuration.

The retainer plate 232 may be configured to come into contact with the seal portion 235 on the entire circumference in the periphery of the substrate contacts 236 and to elastically apply the contact pressure to the seal portion 235. FIG. 16 is a sectional view illustrating a power feed module including a retainer plate of another configuration. FIG. 17 is a plan view illustrating the retainer plate of another configuration. This retainer plate 232 includes an extension part 232a formed to surround the entire circumference of the substrate contacts 236 and provided with through holes 232b that cause the base end side of the substrate contacts 236 (the large diameter portions 236a) to pass through. In this configuration, the retainer plate 232 holds or press the seal portion 235 over the entire circumference of the periphery of the substrate contacts 236 as shown by arrows B in FIG. 16. This more uniformly holds or press the seal portion 235 on the entire circumference of the substrate contacts 236 and applies a uniform contact pressure to the seal portion 235 on the entire circumference of the substrate contacts 236. According to this embodiment, as shown in FIG. 16, an electrically insulating spacer 232c is placed between the extension part 232a of the retainer plate 232 and the front plate 250 to electrically insulate the front plate 250 from the retainer plate 232. For the purpose of simplification, the configuration may cause the front plate 250 to come into direct contact with the retainer plate 232 with omission of the spacer 232c and may provide the electrical insulation by means of coating or the like. In the configuration of FIG. 16, the retainer plate 232 is not cantilever-fixed but is double fixed, unlike the configuration of FIG. 13. This configuration more effectively prevents deformation of the retainer plate 232 and provides the higher sealing force, compared with the configuration of FIG. 13.

Figure 13A:
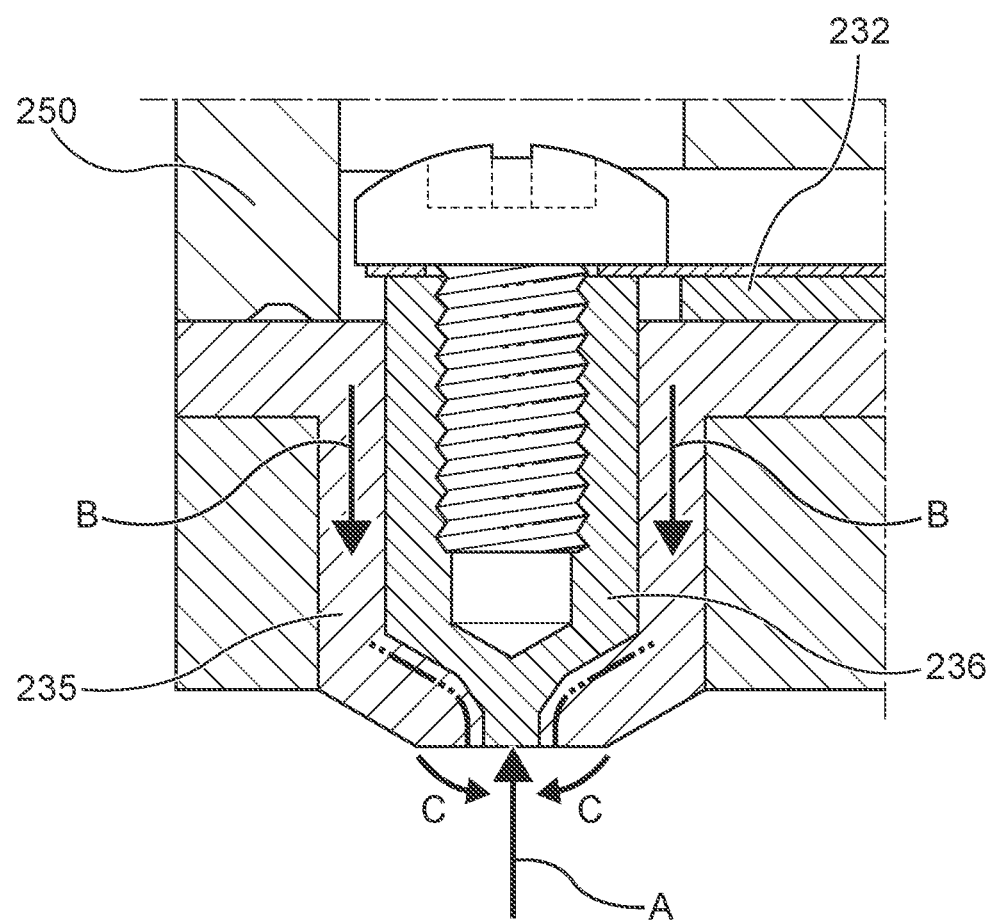
FIG. 13A is a diagram illustrating edge effect of a seal portion.

In either of the configurations of FIG. 13 and FIG. 16, the part (the pressing part) of the retainer plate 232 that applies the contact pressure to the seal portion 235 and the place where the front plate 250 directly comes into contact with the seal portion 235 are located on the outer side than the sealing surface of the seal portion 235 against the substrate, with respect to the substrate contacts 236. As shown in FIG. 13A, this configuration causes the load given to the seal portion 235 by the pressing part (shown by arrows B) to be applied to the outside of the sealing surface, so that the outside (end portion) of the sealing surface receives a moment in a direction toward the substrate contacts 236 (shown by arrows C). This causes the sealing surface to readily maintain the sealing pressure and enhances the sealing effect at a seal edge (edge effect). An arrow A indicates the pressing force of the substrate against the substrate contacts 236 (the acting force which the substrate contacts 236 receive from the substrate).

The contact plate 233 is an electrically conductive member having elasticity and is configured to serve, for example, as a leaf spring. The contact plate 233 is made of, for example, SUS. The contact plate 233 has its base end portion fixed to the projection 264 of the bus bar 260 to be cantilever-supported. As shown in FIG. 13, the base end portion of the contact plate 233 is fixed to the projection 264 of the bus bar 260 by a screw 248, and each of the substrate contacts 236 is mounted to each of leading end elements 243 of the contact plate 233 by the screw 246. The contact plate 233 configured by the cantilever-supported leaf spring implements a configuration that elastically applies the contact force to the substrate contacts 236. Furthermore, as shown in FIG. 7 and FIG. 10, the contact plate 233 has a plurality of the leading end elements 243 that are brought into contact with the substrate contacts 236. The respective leading end elements 243 are provided in the form of leaf electrodes separated from each other by slits 244 and enable the respective substrate contacts 236 to be displaced independently of each other. This configuration thus enables each of the substrate contacts 236 to follow a warpage or a deflection of the substrate and to come into good contact with the substrate. Through holes 243a are formed in the respective leading end elements 243 to cause the screws 246 for mounting the respective leading end elements 243 to the contact plates 236, to pass through. Through holes 245 are formed in the base end portion of the contact plate 233 to cause the screws 248 for mounting the base end portion to the projection 264 of the bus bar 260, to pass through.

As shown in FIG. 13, the contact plate retainer 234 is a member fixed to the projection 264 of the bus bar 260 on the contact plate 233 to hold or press the contact plate 233 and the retainer plate 232. The contact plate retainer 234 is provided to ensure the contact uniformity between the contact plate 233 and the bus bar 260 and to adjust the cantilever rigidity of the contact plate 233. The force of the retainer plate 232 that holds or presses the seal member 231 (the seal portion 235) is also adjusted by the contact plate retainer 234. The contact plate retainer 234 is made of, for example, an electrical insulating material such as vinyl chloride, with a view to providing electrical insulation from the front plate 250. In the case where the electrical insulation from the front plate 250 is ensured by another means, however, the contact plate retainer 234 may be made of a material other than the electrical insulating material. As shown in FIG. 7, the contact plate retainer 234 has through holes 247 provided to cause the screws 248 to pass through. As shown in FIG. 13, the contact plate retainer 234 is arranged such that the contact plate 233 is placed between the retainer plate 232 and the contact plate retainer 234 and between the projection 264 of the bus bar 260 and the contact plate retainer 234, and is also arranged to press the contact plate 233 against the retainer plate 232 and the projection 264. As shown in FIG. 7 and FIG. 13, the screws 248 are screwed to screw holes 265 formed in an end face of the projection 264 of the bus bar 260 in the state that the contact plate 233 and the contact plate retainer 234 are placed in this order on the retainer plate 232 and the projection 264. Such screwing fixes the contact plate 233 and the contact plate retainer 234 to the end face of the projection 264 of the bus bar 260. This configuration electrically connects the contact plate 233 with the bus bar 260 with maintaining the contact uniformity. Additionally, this simple configuration enables the cantilever rigidity of the contact plate 233 to be adjusted by adjusting the pressing force and/or the pressing range by the contact plate retainer 234. This simple configuration also enables the force of the retainer plate 232 that holds or presses the seal member 231 (the seal portion 235) to be adjusted by adjusting the pressing force and/or the pressing range of the contact plate retainer 234.

The bus bar 260 includes a holder portion 261 to mount the power feed module 230 and a thick wall portion 262 provided on the outside of the holder portion 261. The holder portion 261 has the through hole 263 provided to cause the seal member 231 to pass through; the projection 264 provided to be connected with the contact plate 233; the screw holes 265 formed in the end face of the projection 264; a through hole 267 provided to cause the protrusion 240 of the seal member 231 to pass through; and through holes 268 provided to cause the pins 270 to pass through. The surface of the bus bar 260 other than the end face of the projection 264 that is to be connected with the contact plate 233 is subjected to surface coating, such as PFA coating, which has the electrical insulating/corrosion resistant functions, so as to ensure the electric insulation and the corrosion resistance against the plating solution. This insulation coating protects the bus bar 260 from the plating solution and prevents electric current from directly flowing from the plating solution to the bus bar 260. The shape and the dimensions of the through hole 263 may be any arbitrary shape and dimensions according to the shape and the dimensions of the seal portion 235. For example, the through hole 263 may be a slit-like long hole extended approximately parallel along the longitudinal member 211a as shown in FIG. 7. As shown in FIG. 13, the through hole 263 is configured to receive the seal portion 235 that covers the entire circumference of main parts of the substrate contacts 236 and to position the substrate contacts 236 and the seal portion 235. The projection 264 is formed on the outer side of the through hole 263 to be approximately parallel to the through hole 263. A seal groove 266 may be provided around the base end side of the projection 264 to receive the seal portion 239 of the seal member 231 therein. As shown in FIG. 13, the through hole 267 is formed to cause the protrusion 240 of the seal member 231 to pass through and to be protruded on the back face side of the bus bar 260 by a predetermined length. The through holes 268 are open holes provided to cause the pins 270 to pass through as shown in FIG. 6. FIG. 7 illustrates only the part of the bus bar 260 corresponding to one power feed module 230 and thereby illustrates only part of the through holes 268.

The front plate 250 is made of a metal such as titanium and is subject to surface coating, such as PFA coating, which has the electrical insulating/corrosion resistant functions. The front plate 250 may be made of a material similar to that of the seal member 231 (an elastomer such as rubber). As shown in FIG. 13, the front plate 250 is placed on the front face side of the first holding member 210. The front plate 250 is provided in a back face thereof with one or a plurality of recesses 252 to receive the heads of the screws 248 for fixing the contact plate 233 and with recesses 253 to serve as a space for allowing the substrate contacts 236 and the contact plate 233 to be deformed toward the front plate 250-side, as shown in FIG. 12 and FIG. 13. The recesses 253 also serve to release the screws 246 used to mount the contact plate 233 to the substrate contacts 236. The configuration that the seal portion 235 adheres to the leading end side of the substrate contacts 236, in addition to the configuration that allows the substrate contacts 236 and the contact plate 233 to be deformed toward the front plate 250-side lead to generation of a moment. As shown in FIG. 6 and FIG. 7, the front plate 250 has female threaded screw holes 251 that respectively mate with male threaded portions of the pins 270 and is fixed such as to enclose the bus bar 260 and the like by screw fitting with the pins 270. FIG. 7 illustrates only part of the front plate 250 corresponding to one power feed module 230 and thereby illustrates only part of the screw holes 251. The pin 270 includes a middle portion 272 (shown in FIG. 22) and has a level difference from a leading end portion 271 to abut against the bus bar 260. When the pins 270 are screwed into the screw holes 251, this configuration causes the components from the front plate 250 to the bus bar 260 to be integrated and causes the respective members of the power feed module 230 to be placed/fixed (integrated) according to a predetermined positional relationship between the front plate 250 and the bus bar 260.

Figure 19:
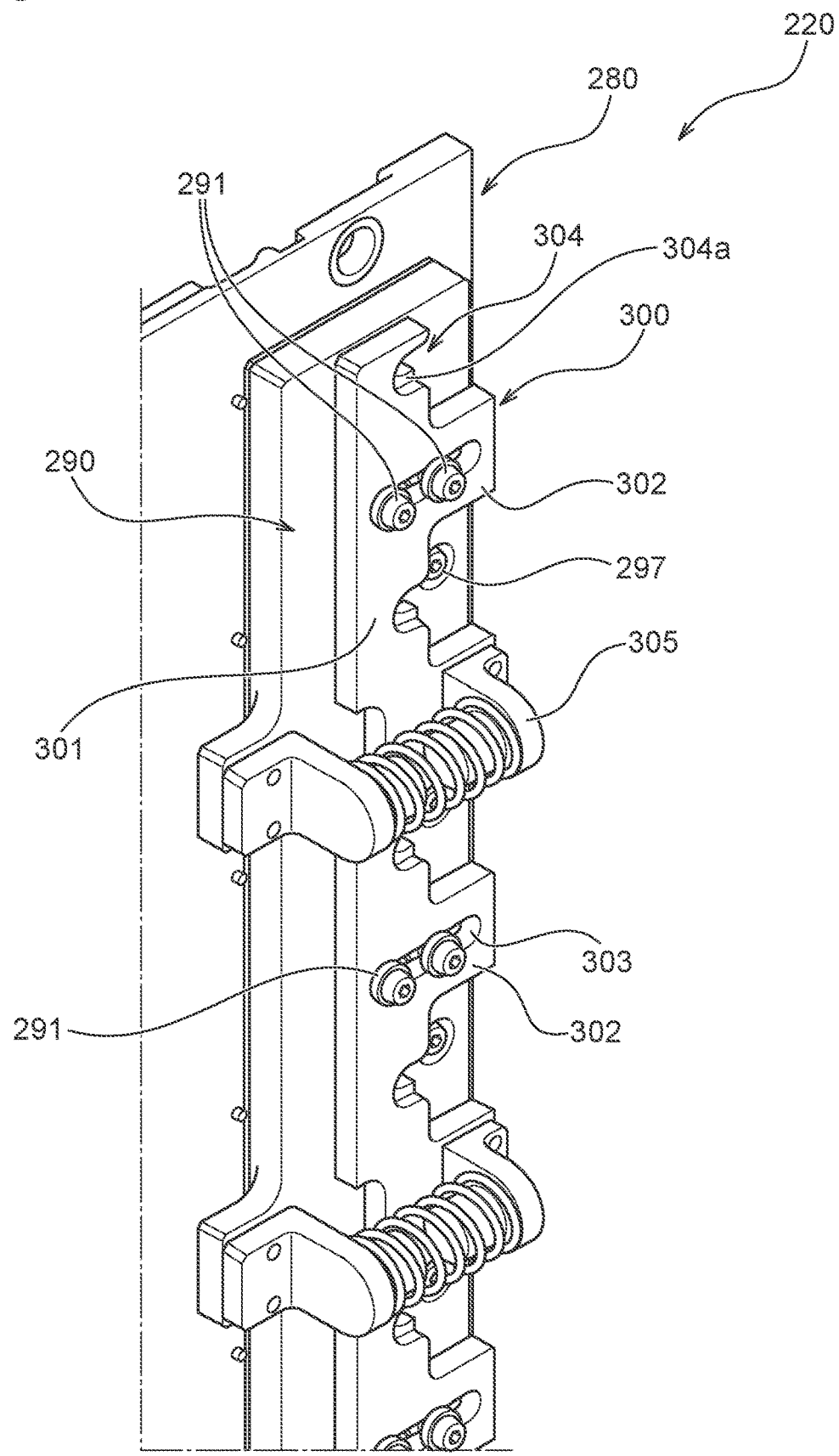
FIG. 19 is a perspective view illustrating close-up of the vicinity of a locking mechanism of a second holding member.
Figure 20:
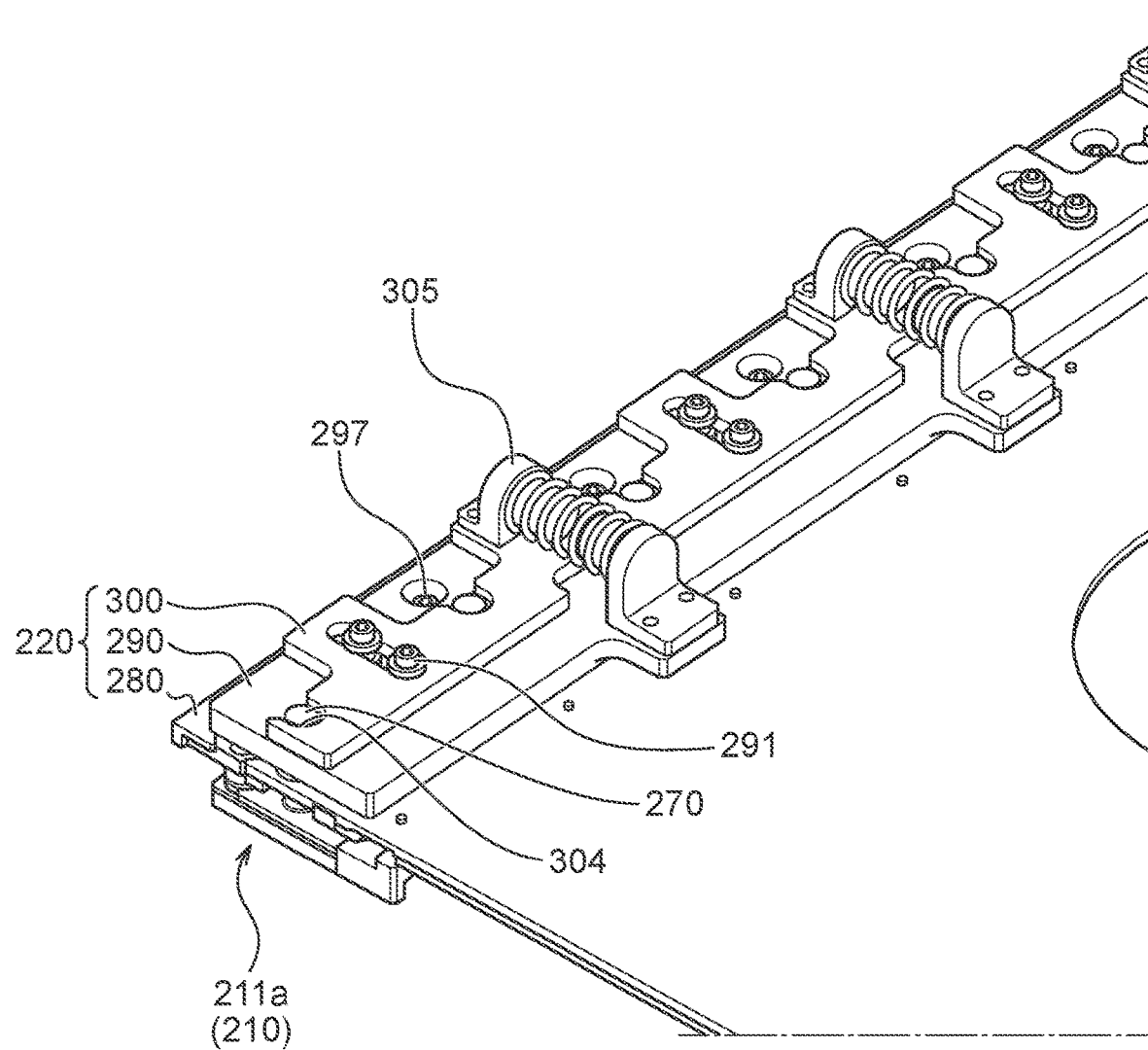
FIG. 20 is a perspective view illustrating the locking mechanism in the state that a first holding member and the second holding member are engaged with each other.
Figure 21:
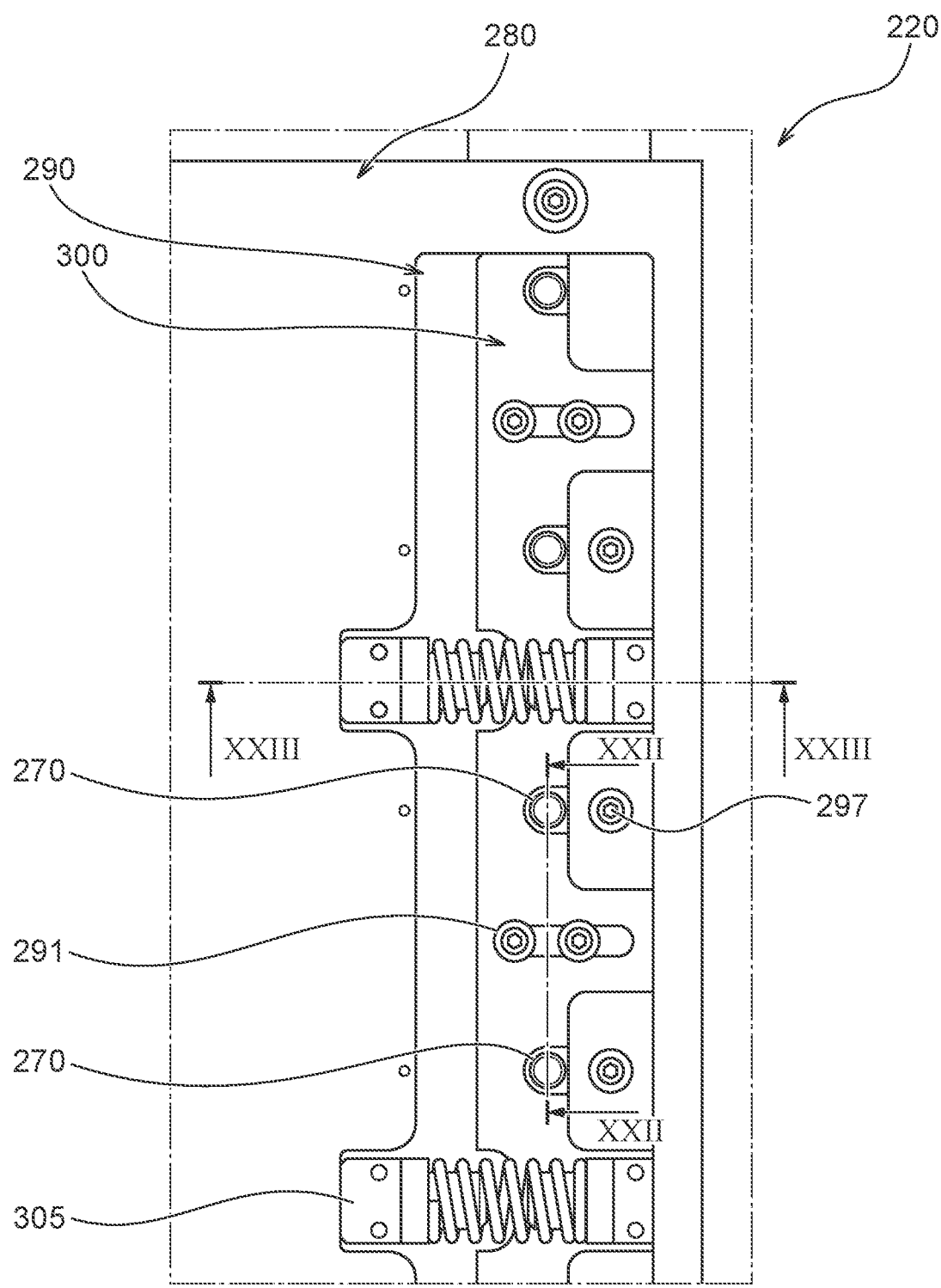
FIG. 21 is a back view illustrating close-up of the vicinity of the locking mechanism of the second holding member.
Figure 22:
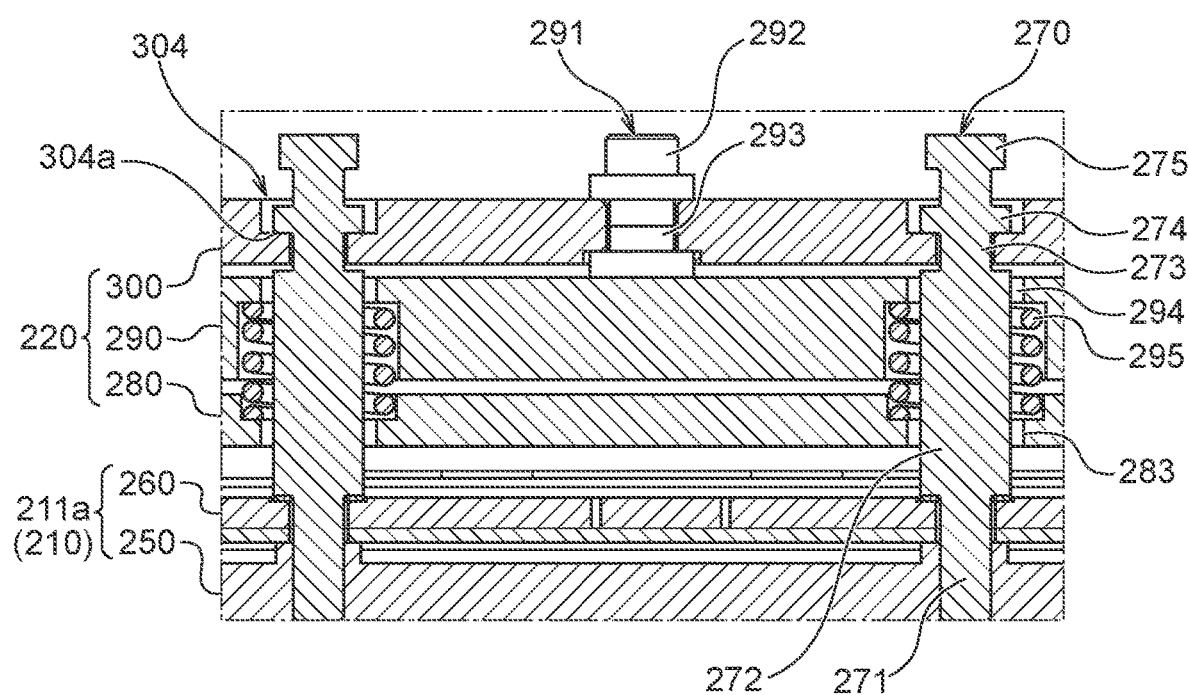
FIG. 22 is a sectional view taken along a line XXII-XXII in FIG. 21 in a locked state.
Figure 23:
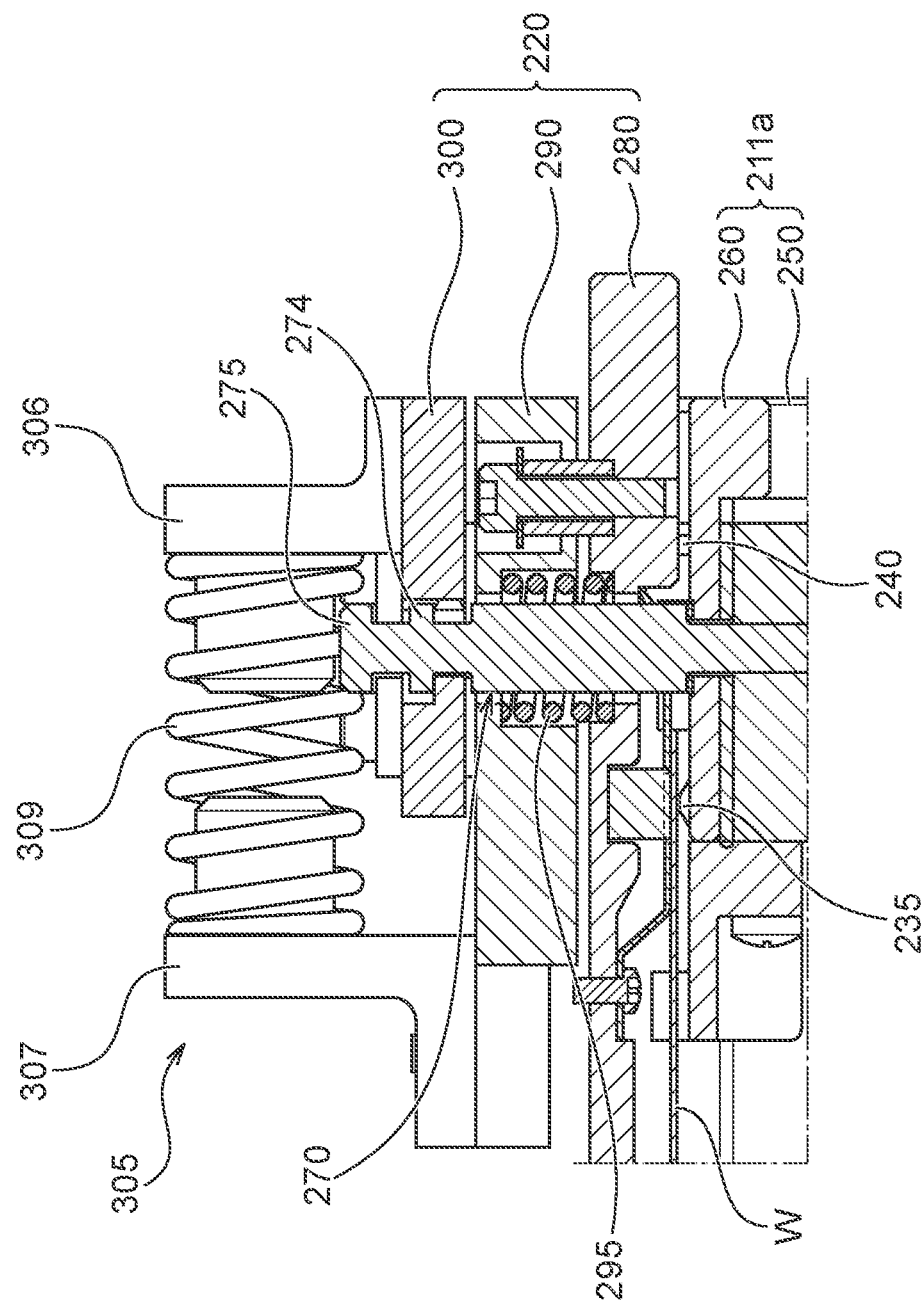
FIG. 23 is a sectional view taken along a line XXIII-XXIII in FIG. 21 in the locked state.

(Substrate Holder Locking mechanism) FIG. 19 is a perspective view illustrating close-up of the vicinity of the locking mechanism of the second holding member. FIG. 20 is a perspective view illustrating the locking mechanism in the state that the first holding member and the second holding member are engaged with each other. FIG. 21 is a back view illustrating close-up of the vicinity of the locking mechanism of the second holding member. FIG. 22 is a sectional view taken along a line XXII-XXII in FIG. 21 in the locked state. FIG. 23 is a sectional view taken along a line XXIII-XXIII in FIG. 21 in the locked state.

(Back Plate and Float Plate)

As shown in FIG. 19, the second holding member 220 includes the back plate 280, the float plates 290 provided to be movable closer to and away from the back plate 280, and the lock plates 300 provided to be slidable relative to the float plates 290 in an in-plane direction. As shown in FIGS. 2 to 4, the back plate 280 is formed to have the dimensions and the shape to cover the substrate W and the parts of the longitudinal members 211a and 211b corresponding to the substrate W. As shown in FIG. 4, the float plates 290 are provided on respective sides of the back face of the back plate 280 along a left side and a right side of the substrate W corresponding to the longitudinal members 211a and 211b of the first holding member 210. A plurality of guide pins 297 (shown in FIG. 19) serve to fix the position of the float plate 290 in the in-plane direction relative to the back plate 280. The float plate 290 is configured to be guided by the guide pins 297 and moved closer to and away from the back plate 280.

A spring 295 is provided between the back plate 280 and the float plate 290 as shown in FIG. 22 and is configured to bias the back plate 280 and the float plate 290 in directions away from each other. More specifically, the lock plate 300 is placed on one end of the spring 295 via the float plate 290, and the back plate 280 is placed on the other end of the spring 295. In other words, the spring 295 is provided between the lock plate 300 and the back plate 280 and is configured to bias the lock plate 300 and the back plate 280 in the directions away from each other. The plurality of pins 270 are lock pins configured to lock the lock plate 300 and thereby lock the second holding member 220 to the first holding member 210. When the second holding member 220 is mounted to the first holding member 210, the pins 270 of the first holding member 210 penetrate inside of the springs 295 of the second holding member 220, pass through the back plate 280 and the float plates 290, and are locked to locking portions 304 of the lock plates 300. In this state, the spring 295 is compressed to bias the float plate 290 (the lock plate 300) and the back plate 280 such as to be separated from each other. This causes the back plate 280 to be pressed against the first holding member 210 and causes the substrate W to be pressed against the seal portion 235 by the back plate 280 when the substrate W is held.

As shown in FIG. 22, the back plate 280 has through holes 283 formed to cause the pins 270 to pass through, and the float plate 290 has through holes 294 formed to cause the pins 270 to pass through. The through hole 283 and the through hole 294 are provided at corresponding positions. The through hole 283 and the through hole 294 respectively have large diameter portions provided on the respective sides facing each other to place the spring 295 therein. These large diameter portions form a space to place the spring 295 therein. One end of the spring 295 abuts against a step at a boundary between the large diameter portion and a small diameter portion of the through hole 283, and the other end of the spring 295 abuts against a step at a boundary between the large diameter portion and a small diameter portion of the through hole 294. This configuration causes the spring 295 to press the back plate 280 and the float plate 290 (the lock plate 300) in the directions away from each other. As shown in FIG. 22, the pin 270 includes a leading end portion 271 that is fixed to (screwed to, according to this embodiment) the first holding member 210, a middle portion 272 that has a larger diameter than the diameter of the leading end portion 271 and that passes through the back plate 280 and the float plate 290, a base end portion 273 that has a smaller diameter than the diameter of the middle portion 272, a flange 274 that is provided in the middle of the base end portion 273, and a flange 275 that is provided at an edge of the base end portion 273. The flange 274 constitutes a first locked portion to lock the substrate holder 200 in the state that the substrate is held. The flange 275 constitutes a second locked portion to semi-lock the substrate holder 200 in the state that the substrate is not held. The semi-locked state causes no load to be applied to the seal portion, for example, during storage of the substrate holder 200. FIG. 22 illustrates the locked state that the lock plate 300 is locked to the flange 274 of the pin 270 and that the substrate is held between the first holding member 210 and the second holding member 220.

(Lock Plate)

As shown in FIG. 4 and FIG. 19, the lock plates 300 are provided along the left side and the right side of the substrate W on the back faces of the float plates 290 corresponding to the longitudinal members 211a and 211b of the first holding member 210. The lock plate 300 includes a base end portion 301, guide portions 302, guide grooves 303 provided in the guide portions 302, locking portions 304 provided in the base end portion 301, and biasing mechanisms 305. The base end portion 301 is formed in a long shape corresponding to the longitudinal member 211a of the first holding member 210 and is provided with a plurality of locking portions 304 along a longitudinal direction thereof to be engaged with the plurality of pins 270 of the first holding member 210. The locking portion 304 is provided to be engageable with the flange 274 or the flange 275 of the pin 270 as shown in FIG. 22. As shown in FIG. 19, the locking portion 304 is formed in a shape roughly corresponding to part of the circumferences (for example, half circumferences) of the flanges 274 and 275 of the pin 270 and has a step 304a that abuts against the bottom face of the flange 274 or the flange 275.

As shown in FIG. 19, the guide portion 302 is extended from the base end portion 301 in a direction crossing the longitudinal direction (i.e. transverse direction) and has the guide groove 303 in a long hole shape extended in the transverse direction. According to the embodiment, the guide groove 303 is extended in a direction perpendicular to the longitudinal direction and is formed to penetrate through the thickness of the guide portion 302. Two guide pins 291 are engaged in the guide groove 303. The guide groove 303 is configured such that the lock plate 300 is guided by these guide pins 291 and is moved on the float plate 290 in a transverse direction relative to the float plate 290. As shown in FIG. 22, the guide pin 291 includes a pin 292 that is fixed to the float plate 290 and a sleeve 293 that is mounted to the outer circumference on a base end side of the pin 292 and that has flanges on respective ends. The lock plate 300 is engaged between the flanges on the respective sides of the sleeve 293. The flanges on the respective sides serve to define or fix the distance between the float plate 290 and the lock plate 300. This configuration causes the lock plate 300 along with the float plate 290 to move closer to and away from the back plate 280.

As shown in FIG. 23, the biasing mechanism 305 includes a spring 309 that is placed between a spring bearing 306 fixed to the lock plate 300 and a spring bearing 307 fixed to the float plate 290. As shown in FIG. 20, the spring 309 serves to bias the lock plate 300 against the float plate 290 in a direction that causes the locking portion 304 to engage with the pin 270 (i.e. outward). In the state of FIG. 20, when the lock plate 300 is moved inward relative to the float plate 290 against the biasing force of the spring 309, the locking portion 304 of the lock plate 300 is separated from the pin 270, and the lock plate 300 is unlocked and released from the pin 270.

(Local Seal Structure)

As shown in FIG. 23, the pin 270 and the spring 295 are provided in the vicinity of the seal portion 235 along the outer circumference of the substrate W (along the left side and the right side of the substrate W in this illustrated example). This configuration accordingly enables the force of the pin 270 and the spring 295 pressing the substrate W via the back plate 280 to be transmitted to the seal portion 235 directly and by a short transmission pathway. This reduces a load applied to the substrate W by the pressing force of the pin 270 and the spring 295. As a result, this configuration applies an appropriate pressing force to the seal portion 235 to seal the substrate contact 236, while reducing the load applied to the substrate W. This configuration is especially effective for a large-sized substrate. In some cases, it may be difficult to apply a uniform force to the seal portion 235 over a long length of the large-sized substrate. The configuration of this embodiment, on the other hand, implements a local seal structure that enables the force of the pin 270 and the spring 295 pressing the substrate via the back plate 280 to be transmitted to the seal portion 235 directly and by the short transmission pathway and thereby appropriately seals the seal portion 235 over the long distance, while reducing the load applied to the substrate W.

Furthermore, the protrusion 240 of the seal member 231 is configured such that the pin 270 and the spring 295 are placed between the protrusion 240 and the seal portion 235 in an outward direction of the substrate W. The outward direction of a substrate indicates a direction that is perpendicular to a side of the substrate or to a tangent of a periphery of the substrate and goes outward. In the case of a circular substrate, the outward direction denotes outward in a radial direction. In the case of a polygonal substrate, the outward direction denotes a direction that is perpendicular to a side and goes outward. This configuration causes the seal portion 235 and the protrusion 240 to serve as a pressure receiver that receives the pressing force of the pin 270 and the spring 295. This establishes a local seal configuration or structure that effectively applies an appropriate biasing force to the seal portion 235 as a place to supply the power and to seal and further suppresses a load due to the biasing force from being applied to the entire substrate. The pressing force of the pin 270 and the spring 295 is received by the seal portion 235 on the inside of the pin 270 and the spring 295 and is received by the protrusion 240 on the outside of the pin 270 and the spring 295. This is unlikely to cause deformation of the first holding member 210 (the longitudinal members 211a and 211b). Furthermore, the seal member 231 is arranged in a plurality of modules, and the seal portion 235 and the protrusion 240 are respectively placed in the form of a plurality of divisions along a side of the substrate. This configuration thus ensures an appropriate sealing pressure required to protect the substrate contacts 236 from the plating solution. A known configuration of a conventional substrate holder uses an integral seal member provided along to be in contact with a side of the substrate. In some cases, however, it is difficult for the integral seal member to generate a uniform sealing pressure along the side of the substrate. An excessive sealing pressure is likely to be generated and to damage the substrate in some cases.

Moreover, the local seal structure achieved by the localized biasing force of a plurality of pins 270 and a plurality of springs 295 locally provided along the outer circumferential part of the substrate W cooperates with the local seal structure that seals each of the power feed modules 230 or each of the substrate contacts 236 by means of the seal portion 235 to achieve a more localized seal. This further enhances the adaptability to the large-sized substrate. Another elastic element may be used in place of the spring 295.

(Method of Mounting and Demounting Substrate)

In the substrate holder 200 in the state that the substrate is not held (for example, in the semi-locked state), the lock plate 300 is slid inward relative to the float plate 290 to compress the springs 309 of the biasing mechanisms 305 and release the locking portions 304 of the lock plate 300 from the pins 270. The second holding member 220 is subsequently detached from the first holding member 210, and the substrate W is placed on the first holding member 210. The second holding member 220 with the springs of the biasing mechanisms 305 in the compressed state is then placed on the longitudinal members 211a and 211b of the first holding member 210 with the substrate W placed thereon. The float plate 290 (and/or the lock plate 300) is subsequently pressed down toward the back plate 280 to adjust the height of the locking portions 304 of the lock plate 300 such as to be engageable with the flanges 274 of the pins 270 (shown in FIG. 23). The locking portions 304 of the lock plate 300 are then engaged with the flanges 274 of the pins 270 by releasing the compression of the springs 309 of the biasing mechanisms 305. This causes the substrate W to be held in the locked state by the substrate holder 200.

A procedure of demounting the substrate slides the lock plate 300 inward relative to the float plate 290 such as to compress the springs 309 of the biasing mechanisms 305 of the substrate holder 200 with the substrate held thereby and releases the locking portions 304 of the lock plate 300 from the pins 270. The second holding member 220 is subsequently detached from the first holding member 210, and the substrate W is demounted from the first holding member 210. The second holding member 220 with the springs 309 of the biasing mechanisms 305 in the compressed state is then placed on the longitudinal members 211a and 211b of the first holding member 210 without the substrate. The float plate 290 (and/or the lock plate 300) is subsequently pressed down toward the back plate 280 to adjust the height of the locking portions 304 of the lock plate 300 such as to be engageable with the flanges 275 of the pins 270. The locking portions 304 of the lock plate 300 are then engaged with the flanges 275 of the pins 270 by releasing the compression of the springs 309 of the biasing mechanisms 305. This causes the substrate holder 200 to be in the semi-locked state.

In the configuration described above, when the substrate is placed between and held by the substrate holder 200, the substrate contacts 236 are cantilever-supported by the contact plate 233 that is the leaf spring and are accordingly displaced in a direction opposite to the direction of the contact pressure (pressure to the substrate side) by the acting force from the substrate side (shown by the arrow A in FIG. 13). The seal portion 235 is, on the other hand, held by the retainer plate 232 and receives the acting force from the retainer plate 232 and the front plate 250 (shown by the arrows B in FIG. 13), thereby tending to remain in the direction of the contact pressure. In other words, the location that applies the contact pressure to the substrate contacts 236 and the location that applies the contact pressure to the seal portion 235 are independent of each other. This configuration exerts the action that causes the substrate contacts 236 to be displaced in the direction opposite to the contact pressure by the acting force received from the substrate side and that causes the sealing surface of the seal portion 235 to remain. This action generates the sealing pressure of the seal portion 235. This configuration thus ensures generation of a sufficient sealing pressure against the substrate and protects the substrate contacts 236 from the plating solution. This accordingly keeps the periphery of the substrate contacts 236 dried and effectively suppresses or prevents dissolution of the substrate seed layer. The configuration that the leading ends of the substrate contacts are flush with and flat with the leading end of the seal portion has similar functions and advantageous effects to those of a configuration that the leading ends of the substrate contacts are retreated from the leading end of the seal portion, while preventing the liquid from remaining at the leading ends of the substrate contacts. The retainer plate 232 and the location of the front plate 250 that comes into contact with the seal portion 235 may be collectively referred to as the "retainer member".

Furthermore, the configuration that the substrate contacts 236 adhere to the seal portion 235 by only the leading end side thereof and that the seal portion 235 is displaceable relative to the bus bar 260 causes the seal portion 235 to be smoothly compressed as a whole in a direction of the contact pressure and causes the base end side of the seal portion 235 to be displaced and/or deformed independently of the substrate contacts 236 and to strongly press the sealing surface against the substrate. This configuration further enhances the effect of increasing the sealing pressure.

Even when the substrate contact 236 is exposed to and comes into contact with the plating solution, the configuration that the leading end side of the substrate contact 236 adheres to the seal portion 235 suppresses or prevents the plating solution from entering between the substrate contact 236 and the seal portion 235 and minimizes the exposure and the contact of the substrate contact 236 to and with the plating solution. This accordingly further suppresses or prevents dissolution of the substrate seed layer. Moreover, the configuration that the leading end side of the seal portion 235 adheres to the substrate contact 236 suppresses the leading end side of the seal portion 235 from being excessively deformed and/or inclined and ensures generation of sufficient sealing pressure in the sealing surface.

The seal member 231 is integrally molded with the substrate contacts 236 by vulcanization molding and adheres to the substrate contacts 236 by crosslinking adhesion. This configuration enhances the adhesive strength between the leading end side of the substrate contact 236 and the seal member 231 and more reliably suppresses or prevents the plating solution from entering between the leading end side of the substrate contact 236 and the seal member 231.

In the configuration describes above, the base end side of the substrate contacts 236 is protruded from the seal portion 235, and the substrate contacts 236 are elastically pressed by the contact plate 233 for power feeding. The seal portion 235 in the vicinity of the substrate contacts 236 is pressed by the retainer plate 232 between the seal portion 235 and the contact plate 233. This reduces addition of components and enables the substrate contacts 236 and the seal portion 235 to be elastically brought into contact with the substrate by the simple configuration. Furthermore, the contact plate 233 for power feeding serves as the cantilever-supported leaf spring. This reduces addition of components and achieves the elastic contact of the substrate contacts 236 by the simple configuration.

In the configuration described above, the substrate contacts 236 covered by the seal portion 235 pass through the through hole 263 of the bus bar 260 to be positioned. This achieves the compact configuration that the substrate contacts 236 and the seal portion 235 are accurately positioned and held relative to the substrate by the bus bar 260. The through hole 263 serves to suppress deformation of the base end side of the seal portion 235 in a direction parallel to the substrate surface when the substrate contacts 236 and the seal portion 235 are pressed against the substrate. This ensures the sufficient sealing pressure.

In the configuration described above, the seal member 231 and the substrate contacts 236 are provided in the form of a plurality of modules (power feed modules 230). Even in the case of a large-scaled substrate, this configuration facilitates manufacture of the seal member 231 configured to effectively seal one or a plurality of substrate contacts 236 provided along the length of the side of the substrate. Furthermore, the configuration causes each of the substrate contacts 236 to be sealed by the seal portion 235. Even in the case of a large-scaled substrate, this configuration enables the substrate contacts 236 to be effectively sealed by the local seal structure. The above configuration enables the seal member 231 including the substrate contacts 236 to be replaced individually with respect to each of the power feed modules 230. This facilitates maintenance and reduces the cost of the maintenance. This configuration also enables the contact plate 233 to be replaced individually with respect to each of the power feed modules 230 and facilitates maintenance.

The configuration described above enables the power feed modules 230 to be placed according to the size of the substrate used and improves the versatility of the substrate holder. Omission of the power feed module 230 in a non-use area (a part where the substrate is not brought into contact with) reduces the cost of the substrate holder. A dummy member may be placed in the part with omission of the power feed module 230 to shield the bus bar 260 from the plating solution and prevent the electric current from directly flowing from the plating solution to the bus bar 260.

ANOTHER EMBODIMENT

Figure 18:
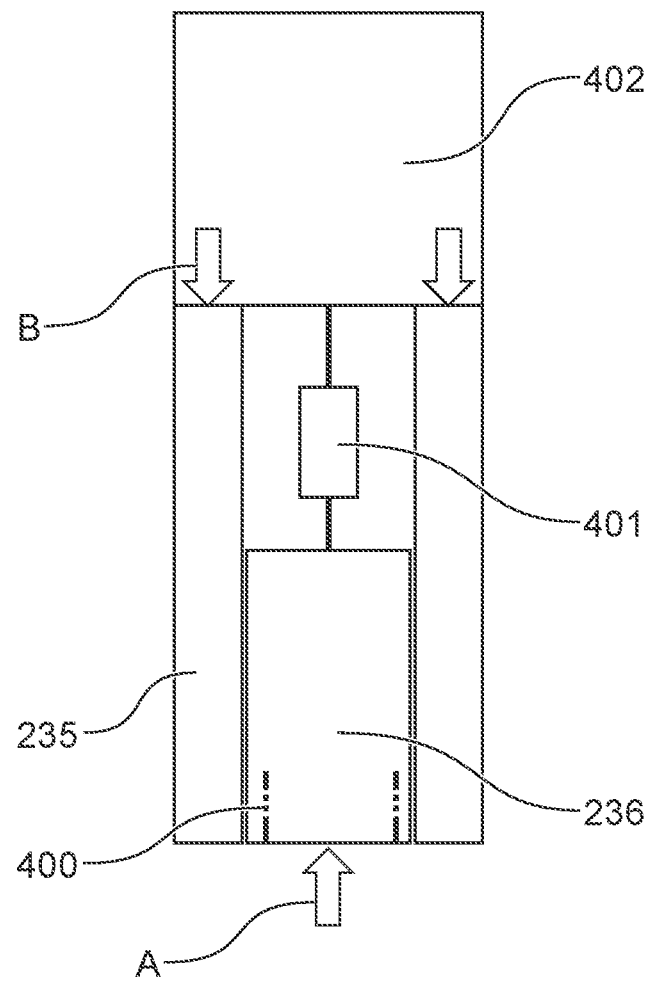
FIG. 18 is a sectional view illustrating a power feed module according to another embodiment.

FIG. 18 is a sectional view illustrating a power feed module according to another embodiment. The following mainly describes different points from those of the above embodiment, while omitting the description with regard to the similar configuration. This embodiment is configured such that a contact block 402 provided to come into contact with a base end face of a seal portion 235 applies the contact pressure to the seal portion 235 and that an elastic member 401 placed between the contact block 402 and a substrate contact 236 elastically applies the contact pressure to the substrate contact 236. In one example, the contact block 402 comes into contact with the seal portion 235 via a plane that is approximately parallel to a sealing surface of the seal portion 235 (a plane approximately parallel to a substrate) to apply the contact pressure to the seal portion 235. The contact block 402 may be provided with respect to each substrate contact 236 (for example, in the form of a shaft) or may be provided commonly with respect to a plurality of substrate contacts 236 (for example, in the form of a bar). The seal portion 235 may be provided as part of the seal member 231 described above.

A leading end side of the substrate contact 236 adheres to the seal portion 235. A reference sign 400 indicates a range of adhesion. The substrate contact 236 may be configured to include a large diameter portion, a small diameter portion, and additionally a tapered portion as needed basis like the embodiment described above and may adhere like the embodiment described above. Like the embodiment described above, the respective substrate contacts 236 may be configured to be surrounded by the seal member 231 (the seal portion 235). Like the embodiment described above, the substrate contacts 236 may be molded integrally with the seal member 231 (the seal portion 235) by vulcanization molding and adhere to the seal member 231 (the seal portion 235) by crosslinking adhesion. A space is, however, provided on a base end side of the seal member 231 to place the elastic member 401 therein. The seal portion 235 may be fit in the through hole 263 to be movable relative to the bus bar 260, like the embodiment described above. The seal portion 235 may have a tapered portion that is thinning toward its sealing surface side, like the embodiment described above. The elastic member 401 may be an electrically conductive elastic member (for example, an electrically conductive spring, rubber, resin or the like) that enables the electric power to be fed from the contact block 402 to the substrate contact 236. In one example, the elastic member 401 may be a spring made of a metal. The elastic member 401 may be fixed or may not be fixed to the contact block 402 and/or the substrate contact 236, as long as the elastic member 401 is arranged to enable the contact force to be transmitted from the contact block 402 to the substrate contact 236 via the elastic member 401. The contact block 402 is provided for each substrate contact 236 and is made of a material having electrical conductivity (for example, a metal). The contact block 402 may be brought into contact with or may be mounted to the contact plate 233 described above to be held or pressed by the contact plate 233. In this configuration, however, it is preferable that the contact plate 233 has a similar rigidity to that of the retainer plate 232 described above, in order to enable the contact plate 233 to appropriately compress the seal portion 235. The rigidity of the contact plate 233 may be adjusted, for example, to increase by expanding the range of the contact plate retainer 234. The contact block 402 may be by any pressing mechanism/means, in place of the contact plate 233.

In this embodiment, the location that applies the contact pressure to the substrate contact 236 (the location where the elastic member 401 comes into contact with the substrate contacts 236) and the location that applies the contact pressure to the seal portion 235 (the location where the contact block 402 comes into contact with the seal portion 235) are independent of each other. The seal portion 235 adheres to the leading end side of the substrate contact 236 and is configured to move relative to the base end side of the substrate contact 236. This embodiment accordingly has similar functions and advantageous effects to those of the embodiment described above. In this embodiment, the contact pressure is applied to the substrate contact 236 via the elastic member 401. This configuration thus readily suppresses an excessive force from being applied to the substrate by the contact of the substrate with the substrate contact 236.

OTHER EMBODIMENTS (1) According to the embodiments described above, the substrate holder 200 is provided with the power feed devices along the two sides of the substrate W. According to another embodiment, the substrate holder 200 may be provided with power feed devices along the entire circumference of the substrate W.

(2) The configuration of the plurality of power feed modules 230 described above may be applied to a substrate holder for both-side plating. For example, the plurality of power feed modules 230 may be placed on both the first holding member and the second holding member of the substrate holder.

(3) According to the embodiment described above, the continuous integral front plate is provided along the bus bars. According to another embodiment, individual front plates may be provided corresponding to individual power feed modules. In the latter case, each individual front plate serves in cooperation with the seal member 231 to protect the substrate contacts 236 in each of the power feed modules. Accordingly, it may be regarded that each individual front plate is included as part of each individual power feed module. Each individual front plate may be made of the same material as that of the seal member 231.

At least the following aspects are provided from the embodiments described above.

According to a first aspect, there is provided a contact structure, comprising a substrate contact including a first contact portion that is located on a leading end side of the substrate contact and that comes into contact with a substrate and a second contact portion that is located nearer to a base end side of the substrate contact than the first contact portion; a seal member configured to cover a periphery of the substrate contact and to have a sealing surface that comes into contact with the substrate to seal the substrate contact; a first pressing portion configured to elastically apply a contact pressure on the substrate to the substrate contact; and a second pressing portion configured to come into contact with the seal member and to apply a contact pressure on the substrate to the seal member independently of the first pressing portion, wherein the first contact portion adheres to the seal member, and the second contact portion is fit in the seal member to be displaceable relative to the seal member. As long as a range including a leading end of the first contact portion out of its circumference adheres to the seal member, it is not necessary that the entire circumference of the first contact portion adheres to the seal member.

In the contact structure of this aspect, the location that elastically applies the contact pressure to the substrate contact and the location that applies the contact pressure to the seal member (a seal portion) are independent of each other. This configuration causes the substrate contact to be displaced in a direction opposite to the contact pressure (in a direction opposite to the substrate) by the acting force received from the substrate side, while causing the sealing surface of the seal member to remain, when the substrate is held by a substrate holder. This generates the sealing pressure of the seal member. The configuration that only the leading end side of the substrate contact adheres to the seal member enables the base end side of the seal member to be displaced and/or deformed independently of the substrate contact and strongly presses the sealing surface against the substrate. This configuration further enhances the effect of increasing the sealing pressure. This configuration thus ensures generation of a sufficient sealing pressure of the seal member against the substrate and protects the substrate contact from a plating solution. This accordingly keeps the periphery of the substrate contact dried and effectively suppresses/prevents dissolution of a substrate seed layer.

Even when the substrate contact is exposed to and comes into contact with the plating solution, the configuration that the leading end side of the substrate contact adheres to the seal member suppresses or prevents the plating solution from entering between the substrate contact and the seal member and minimizes the exposure and the contact of the substrate contact to and with the plating solution. This accordingly further suppresses or prevents dissolution of the substrate seed layer. Moreover, the configuration that the leading end side of the seal member adheres to the seal member suppresses the leading end side of the seal member from being excessively deformed and/or inclined and ensures generation of a sufficient sealing pressure in the sealing surface.

According to a second aspect, in the contact structure of the first aspect, the second pressing portion may come into contact with the seal member via a plane that is approximately parallel to the sealing surface of the seal member.

The configuration of this aspect applies the pressing force to the seal member via the plane that is approximately parallel to the sealing surface and thereby enables a sufficient pressing force to be applied to the seal member.

According to a third aspect, in the contact structure of either the first aspect or the second aspect, the second pressing portion may be located on an outer side of the sealing surface of the seal member with respect to the substrate contact.

The configuration of this aspect causes the load applied to the seal member by the second pressing portion to be applied to the outside of the sealing surface and thereby causes the outside (end) of the sealing surface to receive a moment in a direction of the substrate contact. This configuration readily maintains the sealing pressure and enhances the sealing effect at a sealing edge.

According to a fourth aspect, in the contact structure of any one of the first aspect to the third aspect, part of a base end side of the second contact portion may be protruded from the seal member. The contact structure may further comprises a first pressing plate placed on the seal member to come into contact with and press the seal member; and a contact plate configured to feed electric power to the substrate contact and placed on the first pressing plate to come into contact with and elastically press the second contact portion. A contact portion of the contact plate that comes into contact with the second contact portion may serve as the first pressing portion, and a portion of the first pressing plate that presses the seal member in part or entirety of a circumference of the substrate contact may serve as the second pressing portion. The first pressing plate may be placed in part or entirety of the circumference of the substrate contact.

In the contact structure of this aspect, the base end side of the substrate contact is protruded from the seal member, and the substrate contact is elastically pressed by the contact plate for power feeding. The seal member in the vicinity of the substrate contact is pressed by the first pressing plate placed between the seal member and the contact plate. This reduces addition of components and enables the first pressing portion and the second pressing portion to be provided by the simple configuration. The contact plate may be configured, for example, in the form of a leaf spring.

According to a fifth aspect, in the contact structure of the fourth aspect, the first pressing plate may have a through hole, and the second contact portion may at least partly pass through the through hole of the first pressing plate.

In the configuration of this aspect, the first pressing plate is placed around the entire circumference of the second contact portion. This configuration enables the seal member to be totally and more uniformly pressed by the entire circumference of the second contact portion.

According to a sixth aspect, the contact structure of either the fourth aspect or the fifth aspect may further comprise a bus bar configured to feed electric power to the contact plate. The seal member may be arranged to pass through a through hole of the bus bar and to be displaced relative to the bus bar, and the contact plate may be fixed to the bus bar on an opposite side to a side where the contact plate comes into contact with the second contact portion and is cantilever-supported by the bus bar.

In the configuration of this aspect, the seal member is positioned in the through hole of the bus bar. The bus bar achieves the compact configuration of accurately positioning and keeping the substrate contact and the seal member relative to the substrate. The configuration of this aspect also suppresses the base end side of the seal member from being deformed in a direction parallel to the substrate surface when the seal member is pressed against the substrate and ensures the sufficient sealing pressure. The configuration that the seal member is displaceable relative to the bus bar enables the seal member as a whole to be smoothly compressed in the direction of the contact pressure. The contact plate for power feeding serves as a cantilever-supported leaf spring. This reduces addition of components and provides the elastic contact of the substrate contact by the simple configuration.

According to a seventh aspect, the contact structure of the sixth aspect may further comprise a second pressing plate placed on the contact plate to adjust a contact uniformity between the contact plate and the bus bar and a cantilever rigidity of the contact plate.

In the configuration of this aspect, the contact plate is pressed against the bus bar by the second pressing plate. This ensures the contact uniformity between the contact plate and the bus bar. Additionally, adjusting the pressing force and/or the pressing range of the second pressing plate enables the cantilever rigidity of the contact plate to be adjusted by the simple configuration. Furthermore, adjusting the pressing force and/or the pressing range of the second pressing plate enables the pressing force of the first pressing plate to be adjusted by the simple configuration.

According to an eighth aspect, in the contact structure of any one of the fourth aspect to the seventh aspect, a plurality of the substrate contacts may be provided, and the contact plate may have a plurality of leading end elements that are mounted to the respective substrate contacts and that are separated from each other to be independently displaced.

The configuration of this aspect causes each of the leading end elements of the contact plate to be displaced independently and thereby enables each of the substrate contacts to be displaced independently. This keeps the good electrical contact with respect to each substrate contact according to the warpage or the deflection of the substrate.

According to a ninth aspect, the contact structure of any one of the first aspect to the third aspect may further comprise a contact block placed on the seal member to come into contact with and press the seal member; and an elastic member placed between the contact block and the second contact portion of the substrate contact. A contact portion of the elastic member that comes into contact with the substrate contact may serve as the first pressing portion, and a contact portion of the contact block that comes into contact with the seal member may serve as the second pressing portion.

The configuration of this aspect causes the contact pressure to be applied to the substrate contact via the elastic member and thereby suppresses or prevents an excessive force from being applied to the substrate by the contact of the substrate contact with the substrate.

According to a tenth aspect, in the contact structure of the ninth aspect, the contact block may be provided with respect to each substrate contact. The configuration of this aspect enables each substrate contact to be displaced independently and to follow the warpage or deflection of the substrate.

According to an eleventh aspect, in the contact structure of either the ninth aspect or the tenth aspect, the elastic member may have electrical conductivity and may be configured to feed electric power from the contact block to the substrate contact via the elastic member. This aspect replaces part of the power feed pathway by the elastic member and thereby enables the contact pressure to be applied to the substrate contact independently of the contact pressure applied to the seal member by the simple and compact configuration.

According to a twelfth aspect, the contact structure of any one of the ninth aspect to the eleventh aspect may further comprise a contact plate configured to feed electric power to the substrate contact and to come into contact with and press the contact block.

This aspect reduces addition of components and enables the first pressing portion and the second pressing portion to be provided by the simple configuration.

According to a thirteenth aspect, in the contact structure of any one of the first aspect to the twelfth aspect, the second contact portion may have a larger diameter than a diameter of the first contact portion.

The configuration of this aspect enables a contact area between the substrate contact and the substrate to be adjusted into a desired range, while ensuring a contact area between the substrate contact and the contact plate. Appropriately adjusting the length of the small-diameter first contact portion ensures the overall rigidity of the entire substrate contact including the small-diameter first contact portion and the large-diameter second contact portion. For example, in the case of integrally molding the substrate contact with the seal member made of rubber, this configuration gives the rigidity to the substrate contact to withstand the pressure in the course of molding.

According to a fourteenth aspect, in the contact structure of the thirteenth aspect, the substrate contact may have a tapered portion between the first contact portion and the second contact portion.

The configuration of this aspect suppresses an abrupt shape change of the substrate contact and enables the substrate contact to be favorably combined with the seal member. This configuration also ensures the fluidity of rubber in the process of integrally molding with the rubber.

According to a fifteenth aspect, in the contact structure of the fourteenth aspect, a connecting part between the tapered portion and the first contact portion and/or a connecting part between the tapered portion and the second contact portion may be rounded.

The configuration of this aspect further suppresses an abrupt shape change of the substrate contact. Providing the tapered portion and the rounded corner shape of the substrate contact further readily ensures the fluidity of rubber in the process of integrally molding the substrate contact and the seal member.

According to a sixteenth aspect, in the contact structure of either the fourteenth aspect or the fifteenth aspect, the tapered portion may adhere to the seal member.

In the contact structure of this aspect, adhesion of the tapered portion that is provided in a direction inclined with respect to the contact pressure enhances the adhesive strength between the substrate contact and the seal portion.

According to a seventeenth aspect, in the contact structure of any one of the first aspect to the sixteenth aspect, the seal member may be molded integrally with the substrate contact by vulcanization molding and may adhere to the substrate contact by crosslinking adhesion.

The configuration of this aspect enhances the adhesive strength between the adhesion location of the substrate contact with the seal member and more reliably suppresses or prevents a plating solution from entering between the leading end side of the substrate contact and the seal member.

According to an eighteenth aspect, in the contact structure of any one of the first aspect to the seventeenth aspect, a leading end of the first contact portion may be configured to be practically flush with the sealing surface of the seal member.

In the contact structure of this aspect, the leading end of the substrate contact is configured to be practically flush with the sealing surface of the seal portion. This configuration suppresses a liquid from remaining at the leading end of the substrate contact.

According to a nineteenth aspect, there is provided a substrate holder comprising a first holding member and a second holding member engaged with each other to hold a substrate placed therebetween, wherein at least one of the first holding member and the second holding member comprises at least one power feed module having the contact structure of any one of the first aspect to the eighteenth aspect. The configuration of this aspect also has the functions and the advantageous effects described in the above aspect.

According to a twentieth aspect, there is provided an apparatus for plating, comprising: the substrate holder of the nineteenth aspect; and a plating tank configured to plate a substrate held by the substrate holder. The configuration of this aspect also has the functions and the advantageous effects described in the above aspect.

According to a twenty-first aspect, there is provided a method of feeding electric power to a substrate. The method comprises causing a substrate contact to come into contact with the substrate, wherein the substrate contact has a periphery covered by a seal member and includes a first contact portion that is located on a side coming into contact with the substrate and that adheres to the seal member and a second contact portion that is located nearer to a base end side of the substrate contact than the first contact portion and that is fit in the seal member to be displaced relative to the seal member; and elastically applying a contact pressure on the substrate to the substrate contact, applying a contact pressure on the substrate to the seal member independently of application of the contact pressure to the substrate contact, and causing the seal member to generate a sealing pressure by an action that causes the substrate contact to be displaced in an opposite direction to the substrate (opposite direction to that of the contact pressure) by an acting force received from a substrate side and that causes the seal member to remain on the substrate. The configuration of this aspect also has the functions and the advantageous effects described in the above aspect.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a part of the effect is exhibited.

The present application claims priority to Japanese patent application No. 2020-163755 filed on Sep. 29, 2020. The entire disclosure of Japanese patent application 2020-153755 filed on Sep. 29, 2020, including the specification, claims, drawings and abstract is incorporated herein by reference in its entirety.

The entire disclosure of Japanese Unexamined Patent Publication No. H08-13198 (Patent Document 1), Japanese Unexamined Patent Publication No. H07-54199 (Patent Document 2), and Japanese Unexamined Patent Publication No. 2000-219998 (Patent Document 3), including the specification, claims, drawings and abstract is incorporated herein by reference in its entirety.

REFERENCE SIGNS LIST 39 plating tank
100 plating apparatus
200 substrate holder
210 first holding member
211a, 211b longitudinal members
212, 213 transverse members
215 rail
216 arm
217 external connecting portion
218a, 218b bus bars
220 second holding member
230 power feed module
231 seal member
232 retainer plate
232a extension part
232b through hole
232c spacer
233 contact plate
234 contact plate retainer
235 seal portion
236 substrate contact
236a large diameter portion
236b tapered portion
236c small diameter portion
236d screw hole
237 seal portion
238 through hole
239 seal portion
240 protrusion
241 cut
242 through hole
243 leading end element
243a through hole
244 slit
245 through hole
246 screw
247 through hole
248 screw
250 front plate
251 screw hole
252, 253 recesses
260 bus bar
261 holder portion
262 thick wall portion
263 through hole
264 projection
265 screw hole
266 seal groove
267 through hole
268 through hole
270 pin
274, 275 flanges
280 back plate
290 float plate
291 guide pin
295 spring
297 guide pin
300 lock plate
301 base end portion
302 guide portion
303 guide groove
304 locking portion
304a step
305 biasing mechanism
309 spring
400 adhesive area
401 elastic member
402 contact block

What is claimed is:

1. A contact structure, comprising:
a substrate contact including a first contact portion that is located on a leading end side of the substrate contact and that comes into contact with a substrate and a second contact portion that is located nearer to a base end side of the substrate contact than the first contact portion;
a seal member configured to cover a periphery of the substrate contact and to have a sealing surface that comes into contact with the substrate to seal the substrate contact;
a first pressing portion configured to elastically apply a contact pressure on the substrate to the substrate contact; and
a second pressing portion configured to come into contact with the seal member and to apply a contact pressure on the substrate to the seal member independently of the first pressing portion, wherein
the first contact portion adheres to the seal member, and
the second contact portion is fit in the seal member to be displaceable relative to the seal member.

2. The contact structure according to claim 1, wherein the second pressing portion comes into contact with the seal member via a plane that is approximately parallel to the sealing surface of the seal member.

3. The contact structure according to claim 1,
wherein the second pressing portion is located on an outer side of the sealing surface of the seal member with respect to the substrate contact.

4. The contact structure according to claim 1,
wherein part of a base end side of the second contact portion is protruded from the seal member,
the contact structure further comprising:
a first pressing plate placed on the seal member to come into contact with and press the seal member; and
a contact plate configured to feed electric power to the substrate contact and placed on the first pressing plate to come into contact with and elastically press the second contact portion, wherein
a contact portion of the contact plate that comes into contact with the second contact portion serves as the first pressing portion, and
a portion of the first pressing plate that presses the seal member in part or entirety of a circumference of the substrate contact serves as the second pressing portion.

5. The contact structure according to claim 4,
wherein the first pressing plate has a through hole, and
the second contact portion at least partly passes through the through hole of the first pressing plate.

6. The contact structure according to claim 4, further comprising:
a bus bar configured to feed electric power to the contact plate, wherein
the seal member is arranged to pass through a through hole of the bus bar and to be displaced relative to the bus bar, and
the contact plate is fixed to the bus bar on an opposite side to a side where the contact plate comes into contact with the second contact portion and is cantilever-supported by the bus bar.

7. The contact structure according to claim 6, further comprising:
a second pressing plate placed on the contact plate to adjust a contact uniformity between the contact plate and the bus bar and a cantilever rigidity of the contact plate.

8. The contact structure according to claim 4,
wherein a plurality of the substrate contacts are provided, and
the contact plate has a plurality of leading end elements that are mounted to the respective substrate contacts and that are separated from each other to be independently displaced.

9. The contact structure according to claim 1, further comprising:
a contact block placed on the seal member to come into contact with and press the seal member; and
an elastic member placed between the contact block and the second contact portion of the substrate contact, wherein
a contact portion of the elastic member that comes into contact with the substrate contact serves as the first pressing portion, and
a contact portion of the contact block that comes into contact with the seal member serves as the second pressing portion.

10. The contact structure according to claim 9,
wherein the contact block is provided with respect to each substrate contact.

11. The contact structure according to claim 9,
wherein the elastic member has electrical conductivity and is configured to feed electric power from the contact block to the substrate contact via the elastic member.

12. The contact structure according to claim 9, further comprising:
a contact plate configured to feed electric power to the substrate contact and to come into contact with and press the contact block.

13. The contact structure according to claim 1,
wherein the second contact portion has a larger diameter than a diameter of the first contact portion.

14. The contact structure according to claim 13,
wherein the substrate contact has a tapered portion between the first contact portion and the second contact portion.

15. The contact structure according to claim 14,
wherein a connecting part between the tapered portion and the first contact portion and/or a connecting part between the tapered portion and the second contact portion are rounded.

16. The contact structure according to claim 14,
wherein the tapered portion adheres to the seal member.

17. The contact structure according to claim 1,
wherein the seal member is molded integrally with the substrate contact by vulcanization molding and adheres to the substrate contact by crosslinking adhesion.

18. The contact structure according to claim 1,
wherein a leading end of the first contact portion is configured to be practically flush with the sealing surface of the seal member.

19. A substrate holder, comprising:
a first holding member and a second holding member engaged with each other to hold a substrate placed therebetween, wherein
at least one of the first holding member and the second holding member comprises at least one power feed module having the contact structure according to claim 1.

20. An apparatus for plating, comprising:
the substrate holder according to claim 19; and
a plating tank configured to plate a substrate held by the substrate holder.

21. A method of feeding electric power to a substrate, the method comprising:
causing a substrate contact to come into contact with the substrate, wherein the substrate contact has a periphery covered by a seal member and includes a first contact portion that is located on a side coming into contact with the substrate and that adheres to the seal member and a second contact portion that is located nearer to a base end side of the substrate contact than the first contact portion and that is fit in the seal member to be displaced relative to the seal member; and
elastically applying a contact pressure on the substrate to the substrate contact, applying a contact pressure on the substrate to the seal member independently of application of the contact pressure to the substrate contact, and causing the seal member to generate a sealing pressure by an action that causes the substrate contact to be displaced in an opposite direction to the substrate by an acting force received from a substrate side and that causes the seal member to remain on the substrate.

* * * * *